(12) United States Patent
Fukuzumi et al.

(10) Patent No.: US 8,217,446 B2
(45) Date of Patent: Jul. 10, 2012

(54) NONVOLATILE SEMICONDUCTOR MEMORY DEVICE AND METHOD OF MANUFACTURING THE SAME

(75) Inventors: Yoshiaki Fukuzumi, Yokohama (JP); Masaru Kito, Yokohama (JP); Ryota Katsumata, Yokohama (JP); Masaru Kidoh, Komae (JP); Hiroyasu Tanaka, Tokyo (JP); Yosuke Komori, Yokohama (JP); Megumi Ishiduki, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 414 days.

(21) Appl. No.: 12/559,865

(22) Filed: Sep. 15, 2009

(65) Prior Publication Data

US 2010/0117137 A1     May 13, 2010

(30) Foreign Application Priority Data

Nov. 10, 2008   (JP) ................. 2008-287807

(51) Int. Cl.
    *H01L 29/792*     (2006.01)
    *H01L 21/336*     (2006.01)
(52) U.S. Cl. ......... 257/324; 257/295; 257/326; 257/329
(58) Field of Classification Search .................. 257/295, 257/324, 326, 329
See application file for complete search history.

(56) References Cited

U.S. PATENT DOCUMENTS

| 7,936,004 | B2 * | 5/2011 | Kito et al. ...................... 257/324 |
| 2007/0252201 | A1 | 11/2007 | Kito et al. |
| 2009/0090960 | A1 * | 4/2009 | Izumi et al. .................... 257/324 |
| 2009/0146206 | A1 | 6/2009 | Fukuzumi et al. |
| 2011/0127597 | A1 | 6/2011 | Fukuzumi et al. |

FOREIGN PATENT DOCUMENTS

| JP | 2007-266143 | 10/2007 |
| JP | 2007-317874 | 12/2007 |
| JP | 2009-146954 | 7/2009 |
| JP | 2010-21390 | 1/2010 |
| WO | WO 2009/075370 A1 | 6/2009 |
| WO | WO 2010/004706 A1 | 1/2010 |

OTHER PUBLICATIONS

Office Action issued Feb. 21, 2011, in Korea Patent Application No. 10-2009-107577 (with English translation).
U.S. Appl. No. 12/679,991, filed Mar. 25, 2010, Fukuzumi et al.

* cited by examiner

*Primary Examiner* — Jerome Jackson, Jr.
*Assistant Examiner* — David Spalla
(74) *Attorney, Agent, or Firm* — Oblon, Spivak, McClelland, Maier & Neustadt, L.L.P.

(57) ABSTRACT

Each of memory strings is provided with a first semiconductor layer having a pair of columnar portions extending in a perpendicular direction with respect to a substrate; a charge storage layer formed to surround a side surface of the columnar portions; and a first conductive layer formed to surround the charge storage layer. Each of the select transistors is provided with a second semiconductor layer extending upwardly from an upper surface of the columnar portions; a gate insulating layer formed to surround a side surface of the second semiconductor layer; and a second conductive layer formed to surround the gate insulating layer. An effective impurity concentration of the second semiconductor layer is less than or equal to an effective impurity concentration of the first semiconductor layer.

11 Claims, 27 Drawing Sheets

US 8,217,446 B2

NONVOLATILE SEMICONDUCTOR MEMORY DEVICE AND METHOD OF MANUFACTURING THE SAME

CROSS REFERENCE TO RELATED APPLICATIONS

This application is based upon and claims the benefit of priority from prior Japanese Patent Application No. 2008-287807, filed on Nov. 10, 2008, the entire contents of which are incorporated herein by reference.

BACKGROUND OF THE INVENTION

1. Field of the Invention

The present invention relates to an electrically rewritable nonvolatile semiconductor memory device and a method of manufacturing the same.

2. Description of the Related Art

Conventionally, an LSI is formed by integrating elements in a two-dimensional plane on a silicon substrate. It is common practice to increase a storage capacity of memory by reducing dimensions of (miniaturizing) an element. However, in recent years, even this miniaturization is becoming difficult in terms of cost and technology. Improvements in photolithographic technology are necessary for miniaturization, but costs required for lithographic processes are steadily increasing. Moreover, even if miniaturization is achieved, it is expected that physical limitations such as those of withstand voltage between elements will be encountered, unless the drive voltage and so on are scaled. In other words, there is a high possibility that operation as a device will become difficult.

Accordingly, in recent years, there is proposed a semiconductor memory device in which memory cells are disposed three-dimensionally in order to increase a degree of integration of memory (refer to patent document 1: Japanese Unexamined Patent Application Publication No. 2007-266143).

One conventional semiconductor memory device in which memory cells are disposed three-dimensionally uses transistors with a cylindrical column-shaped structure (patent document 1). The semiconductor memory device using the transistors with the cylindrical column-shaped structure is provided with multi-layers conductive layer configured to form gate electrodes, and pillar-shaped columnar semiconductors. The columnar semiconductor functions as a channel (body) portion of the transistors. A vicinity of the columnar semiconductor is provided with a memory gate insulating layer. A configuration including these conductive layer, columnar semiconductor, and memory gate insulating layer is called a memory string.

In a case that the above-described conventional technology is used for further integrating, a length of the columnar semiconductor increases. Consequently, a cell current needs to be increased. At the same time, there is a need to reduce leak current from a non-selected memory string to secure a read margin.

SUMMARY OF THE INVENTION

In accordance with a first aspect of the present invention, a nonvolatile semiconductor memory device includes: a plurality of memory strings each of which has a plurality of electrically rewritable memory cells connected in series; and select transistors one of which is connected to each of ends of each of the memory strings, each of the memory strings including: a first semiconductor layer having a pair of columnar portions extending in a perpendicular direction with respect to a substrate, and a joining portion formed so as to join lower ends of the pair of columnar portions; a charge storage layer formed to surround a side surface of the columnar portions; and a first conductive layer formed to surround the charge storage layer and the side surface of the columnar portions, and each of the select transistors including: a second semiconductor layer extending upwardly from an upper surface of the columnar portions; a gate insulating layer formed to surround a side surface of the second semiconductor layer; and a second conductive layer formed to surround the gate insulating layer and the side surface of the second semiconductor layer, the first conductive layer functioning as a control electrode of the memory cells, the second conductive layer functioning as a control electrode of the select transistors, and an effective impurity concentration of the second semiconductor layer being less than or equal to an effective impurity concentration of the first semiconductor layer.

In accordance with a second aspect of the present invention, a method of manufacturing a nonvolatile semiconductor memory device, the nonvolatile semiconductor memory device including a plurality of memory strings, each of which has a plurality of electrically rewritable memory cells connected in series, and select transistors, one of which is connected to each of ends of each of the memory strings, includes: depositing a plurality of first conductive layers sandwiched by a first interlayer insulating layer; depositing on an upper layer of the first conductive layers a second conductive layer sandwiched by a second interlayer insulating layer; forming a first hole by penetrating the plurality of first conductive layers in a U-shape as viewed from a direction parallel to a substrate; forming a second hole by penetrating the second conductive layer; forming a charge storage layer in a side wall of the first conductive layers in the first hole; forming an insulating layer in a side wall of the second conductive layer in the second hole; forming a first semiconductor layer so as to fill the first hole; forming a second semiconductor layer so as to fill the second hole; and setting an effective impurity concentration of the second semiconductor layer to be less than or equal to an effective impurity concentration of the first semiconductor layer.

DETAILED DESCRIPTION OF THE EMBODIMENTS

Embodiments of a nonvolatile semiconductor memory device in accordance with the present invention are described below with reference to the drawings.

First Embodiment (Configuration of a Nonvolatile Semiconductor Memory Device 100 in Accordance with a First Embodiment)

Figure 1:
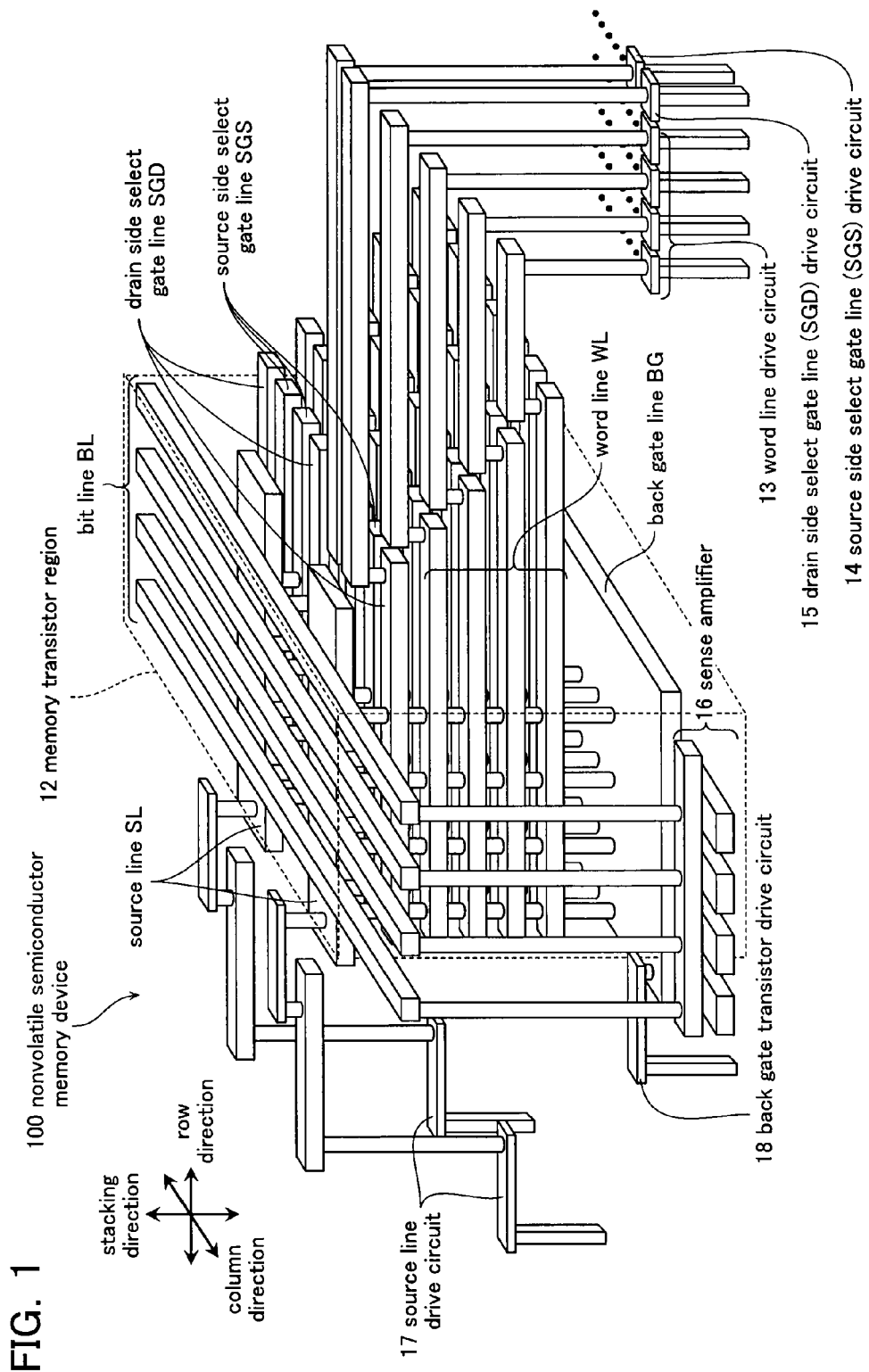
FIG. 1 is a schematic view of a configuration of a nonvolatile semiconductor memory device 100 in accordance with a first embodiment of the present invention.

FIG. 1 shows a schematic view of a nonvolatile semiconductor memory device 100 in accordance with a first embodiment of the present invention. As shown in FIG. 1, the nonvolatile semiconductor memory device 100 in accordance with the first embodiment mainly includes a memory transistor region 12, a word line drive circuit 13, a source side select gate line (SGS) drive circuit 14, a drain side select gate line (SGD) drive circuit 15, a sense amplifier 16, a source line drive circuit 17, and a back gate transistor drive circuit 18. The memory transistor region 12 includes memory transistors configured to store data. The word line drive circuit 13 controls a voltage applied to a word line WL. The source side select gate line (SGS) drive circuit 14 controls a voltage applied to a source side select gate line (SGS). The drain side select gate line (SGD) drive circuit 15 controls a voltage applied to a drain side select gate line (SGD). The sense amplifier 16 amplifies a potential read from the memory transistors. The source line drive circuit 17 controls a voltage applied to a source line SL. The back gate transistor drive circuit 18 controls a voltage applied to a back gate line BG. Note that, in addition to the above, the nonvolatile semiconductor memory device 100 in accordance with the first embodiment includes a bit line drive circuit (not shown) configured to control a voltage applied to a bit line BL.

Figure 2:
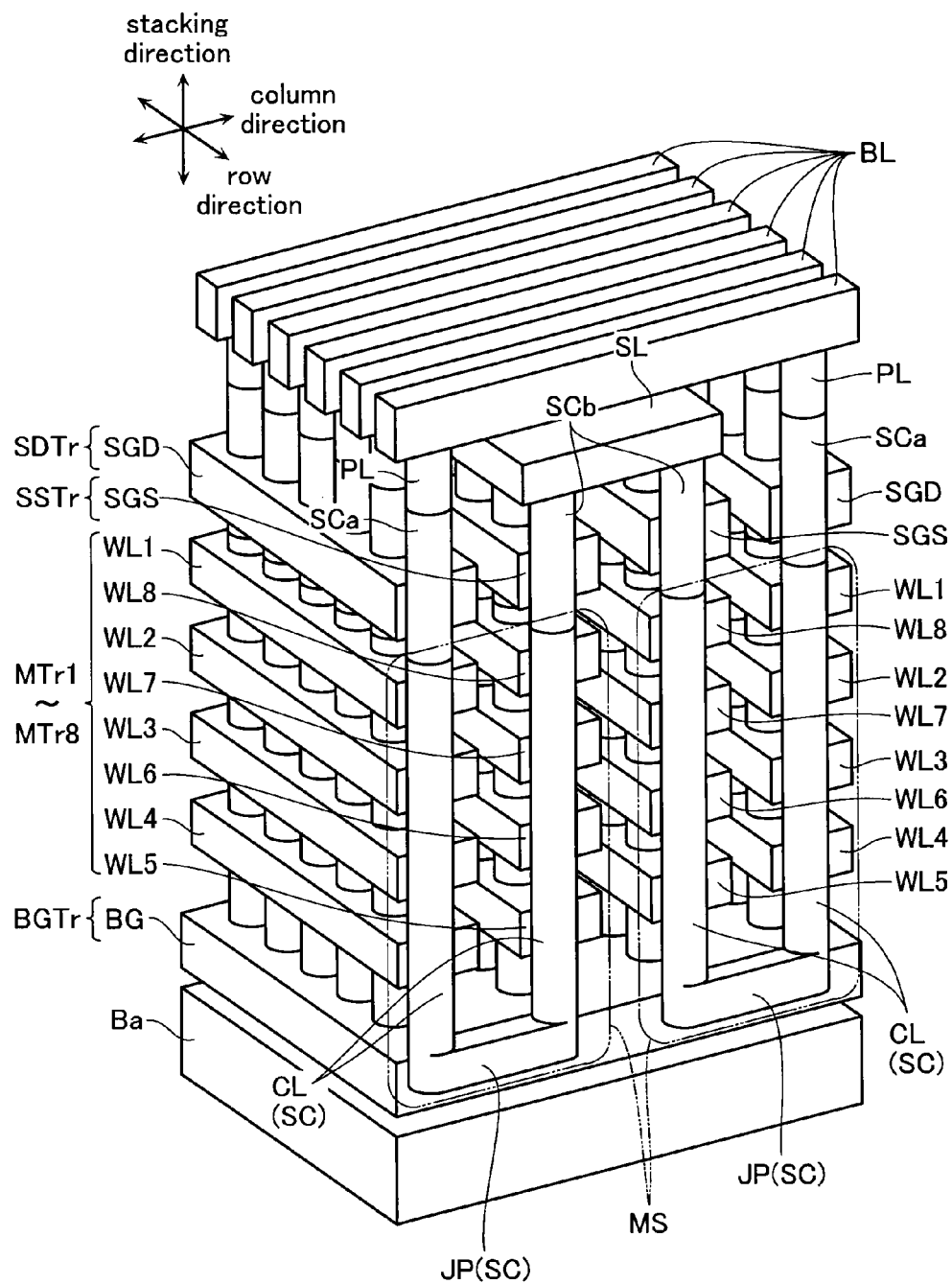
FIG. 2 is a partial schematic perspective view of a memory transistor region 12 in accordance with the first embodiment of the present invention.

FIG. 2 is a schematic perspective view of part of the memory transistor region 12 of the nonvolatile semiconductor memory device 100 in accordance with the first embodiment. In the first embodiment, the memory transistor region 12 includes m×n each of memory strings MS, source side select transistors SSTr, and drain side select transistors SDTr (where m and n are natural numbers). FIG. 2 shows an example where m=6 and n=2.

In the nonvolatile semiconductor memory device 100 in accordance with the first embodiment, the memory transistor region 12 is provided with a plurality of the memory strings MS. As will be described in detail later, each of the memory strings MS has a configuration in which a plurality of electrically rewritable memory transistors MTr1-MTr8 are connected in series. The memory transistors MTr1-MTr8 configuring the memory string MS are formed by stacking a plurality of semiconductor layers, as shown in FIGS. 1 and 2.

Each of the memory strings MS includes a U-shaped semiconductor SC, word lines WL1-WL8, and the back gate line BG. The drain side select transistor SDTr includes a columnar semiconductor SCa and the drain side select gate line SGD. The source side select transistor SSTr includes a columnar semiconductor SCb and the source side select gate line SGS.

The U-shaped semiconductor SC is formed in a U shape viewed from a row direction. The U-shaped semiconductor SC includes a pair of columnar portions CL extending in a substantially perpendicular direction with respect to a semiconductor substrate Ba, and a joining portion JP formed so as to join lower ends of the pair of columnar portions CL. Note that the columnar portions CL may be of a cylindrical column shape or of a prismatic column shape. Moreover, the columnar portions CL may be of a column shape that has a tiered shape. Here, the row direction is a direction orthogonal to a stacking direction, and a column direction to be described later is a direction orthogonal to the stacking direction and the row direction.

The U-shaped semiconductors SC are disposed such that a line joining central axes of the pair of columnar portions CL is parallel to the column direction. Furthermore, the U-shaped semiconductors SC are disposed to form a matrix in planes configured from the row direction and the column direction.

The columnar semiconductor SCa is formed so as to extend upwardly from an upper surface of one of the columnar portions CL. The columnar semiconductor SCb is formed so as to extend upwardly from an upper surface of another of the columnar portions CL.

The word lines WL1-WL8 in each layer have a shape extending in parallel to the row direction. The word lines WL1-WL8 in each layer are formed in a repeating manner in lines insulated and isolated from each other and having a predetermined pitch in the column direction. The word line WL1 is formed in a same layer as the word line WL8. Similarly, the word line WL2 is formed in a same layer as the word line WL7, the word line WL3 is formed in a same layer as the word line WL6, and the word line WL4 is formed in a same layer as the word line WL5.

The memory transistors MTr1-MTr8 provided at the same position in the column direction and aligned in the row direction have gates are connected to identical word lines WL1-WL8. An end in the row direction of each of the word lines WL1-WL8 is formed in a stepped shape. Each of the word lines WL1-WL8 is formed so as to surround a plurality of the columnar portions CL lined up in the row direction.

Figure 3:
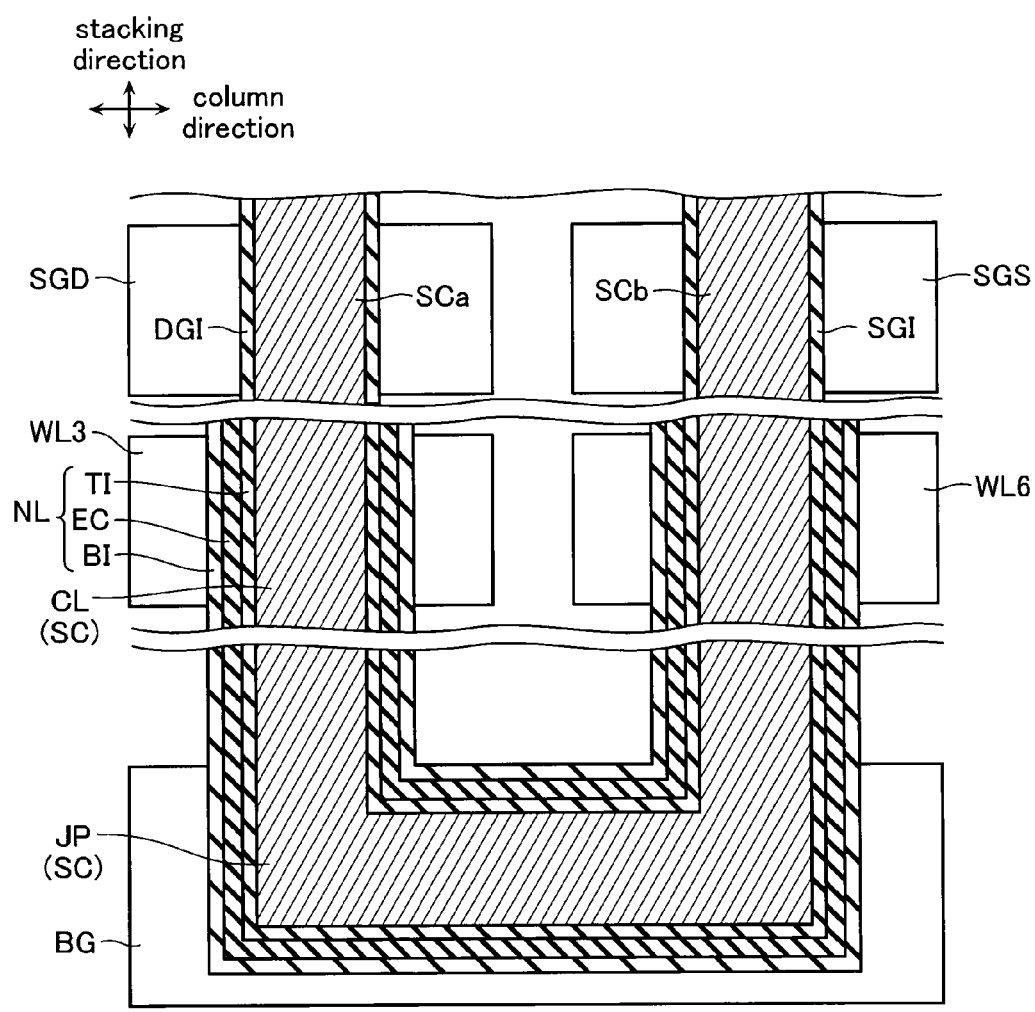
FIG. 3 is an enlarged view of one memory string MS in accordance with the first embodiment of the present invention.

Formed between the word lines WL1-WL8 and the columnar portion CL is an ONO (Oxide-Nitride-Oxide) layer NL, as shown in FIG. 3. The ONO layer NL includes a tunnel insulating layer TI adjacent to the columnar portion CL, a charge storage layer EC adjacent to the tunnel insulating layer TI, and a block insulating layer BI adjacent to the charge storage layer EC. The charge storage layer EC has a function of accumulating a charge. To express the above-described configuration in other words, the charge storage layer EC is formed so as to surround a side surface of the columnar portion CL; and each of the word lines WL1-WL8 is formed so as to surround the charge storage layer EC.

The drain side select gate line SGD is provided upwardly of an uppermost word line WL1 of the word lines. The drain side select gate line SGD has a shape extending in parallel to the row direction. The drain side select gate line SGD is formed in a repeating manner in lines having an alternating predetermined pitch in the column direction, so as to sandwich the source side select gate line SGS to be described hereafter. The drain side select gate line SGD is formed so as to surround each of a plurality of the columnar semiconductors SCa lined up in the row direction. Formed between the drain side select gate line SGD and the columnar semiconductor SCa is a gate insulating layer DGI, as shown in FIG. 3. To express the above-described configuration in other words, each of the drain side select gate lines SGD is formed so as to surround the gate insulating layer DGI.

The source side select gate line SGS is provided upwardly of an uppermost word line WL8 of the word lines. The source side select gate line SGS has a shape extending in parallel to the row direction. The source side select gate line SGS is formed in a repeating manner in lines having a predetermined pitch in the column direction, sandwiching the aforementioned drain side select gate line SGD therebetween. The source side select gate line SGS is formed so as to surround each of a plurality of the columnar semiconductors SCb lined up in the row direction. Formed between the source side select gate line SGS and the columnar semiconductor SCb is a gate insulating layer SGI, as shown in FIG. 3. To express the above-described configuration in other words, each of the source side select gate lines SGS is formed so as to surround the gate insulating layer SGI.

The back gate line BG is formed extending two-dimensionally in the row direction and the column direction so as to cover a lower portion of a plurality of the joining portions JP. Formed between the back gate line BG and each of the joining portions JP is the aforementioned ONO layer NL, as shown in FIG. 3.

Formed at upper ends of a pair of the columnar semiconductors SCb surrounded by the source side select gate line SGS and adjacent in the column direction is the source line SL.

Formed at upper ends of the columnar semiconductors SCa surrounded by the drain side select gate line SGD, with plug lines PL interposed, are the bit lines BL. Each of the bit lines BL is formed so as to be positioned upwardly of the source line SL. Each of the bit lines BL is formed in a repeating manner in lines extending in the column direction and having a predetermined spacing in the row direction.

Figure 4:
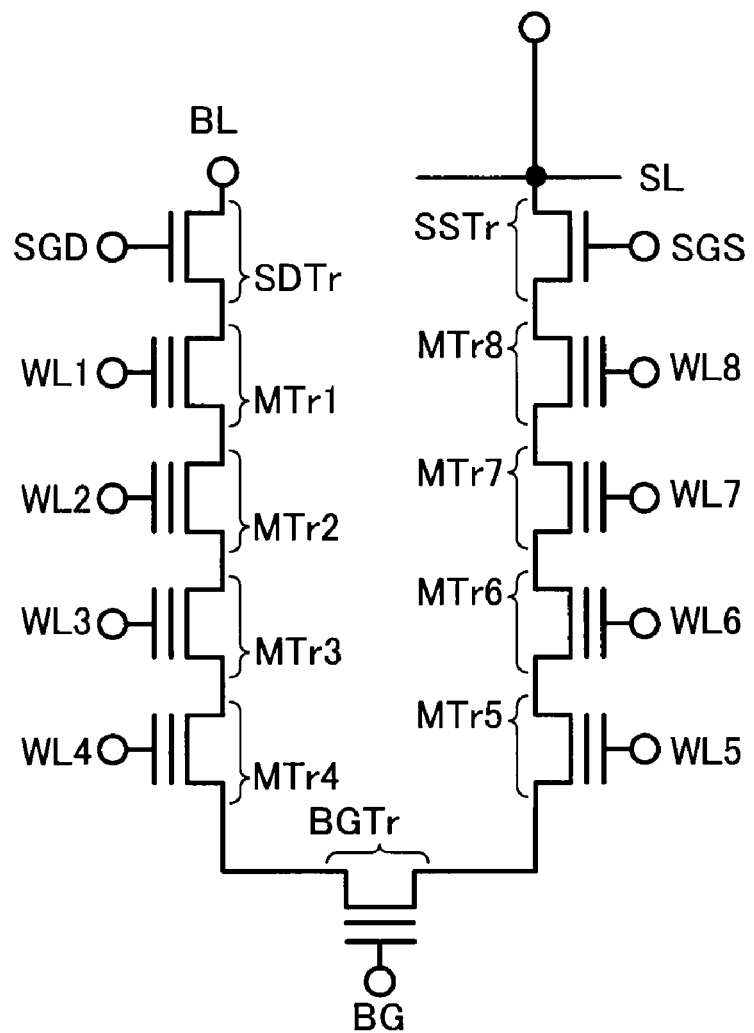
FIG. 4 is a circuit diagram of part of the nonvolatile semiconductor memory device in accordance with the first embodiment of the present invention.

Next, a configuration of a circuit constituted by the memory string MS, the drain side select transistor SDTr, and the source side select transistor SSTr in the first embodiment is described with reference to FIGS. 2-4. FIG. 4 is a circuit diagram of one memory string MS, the drain side select transistor SDTr, and the source side select transistor SSTr in the first embodiment.

Each of the memory strings MS in the first embodiment has eight electrically rewritable memory transistors MTr1-MTr8 connected in series, as shown in FIGS. 2-4. The source side select transistor SSTr is connected to one of two ends of the memory string MS and the drain side select transistor SDTr is connected to another of the two ends of the memory string MS. A back gate transistor BGTr is provided in the memory string MS (between the memory transistor MTr4 and the memory transistor MTr5).

Each of the memory transistors MTr is configured by the columnar portion CL, the ONO layer NL (the charge storage layer EC), and the word line WL. An edge portion of the word line WL in contact with the ONO layer NL functions as a control gate electrode of the memory transistor MTr.

The drain side select transistor SDTr is configured by the columnar semiconductor SCa, the gate insulating layer DGI, and the drain side select gate line SGD. An edge portion of the drain side select gate line SGD in contact with the gate insulating layer DGI functions as a control gate electrode of the drain side select transistor SDTr.

The source side select transistor SSTr is configured by the columnar semiconductor SCb, the gate insulating layer SGI, and the source side select gate line SGS. An edge portion of the source side select gate line SGS in contact with the gate insulating layer SGI functions as a control gate electrode of the source side select transistor SSTr.

The back gate transistor BGTr is configured by the joining portion JP, the ONO layer NL (the charge storage layer EC), and the back gate line BG. An edge portion of the back gate line BG in contact with the ONO layer NL functions as a control gate electrode of the back gate transistor BGTr.

(Specific Configuration of the Nonvolatile Semiconductor Memory Device 100 in Accordance with the First Embodiment)

Figure 5:
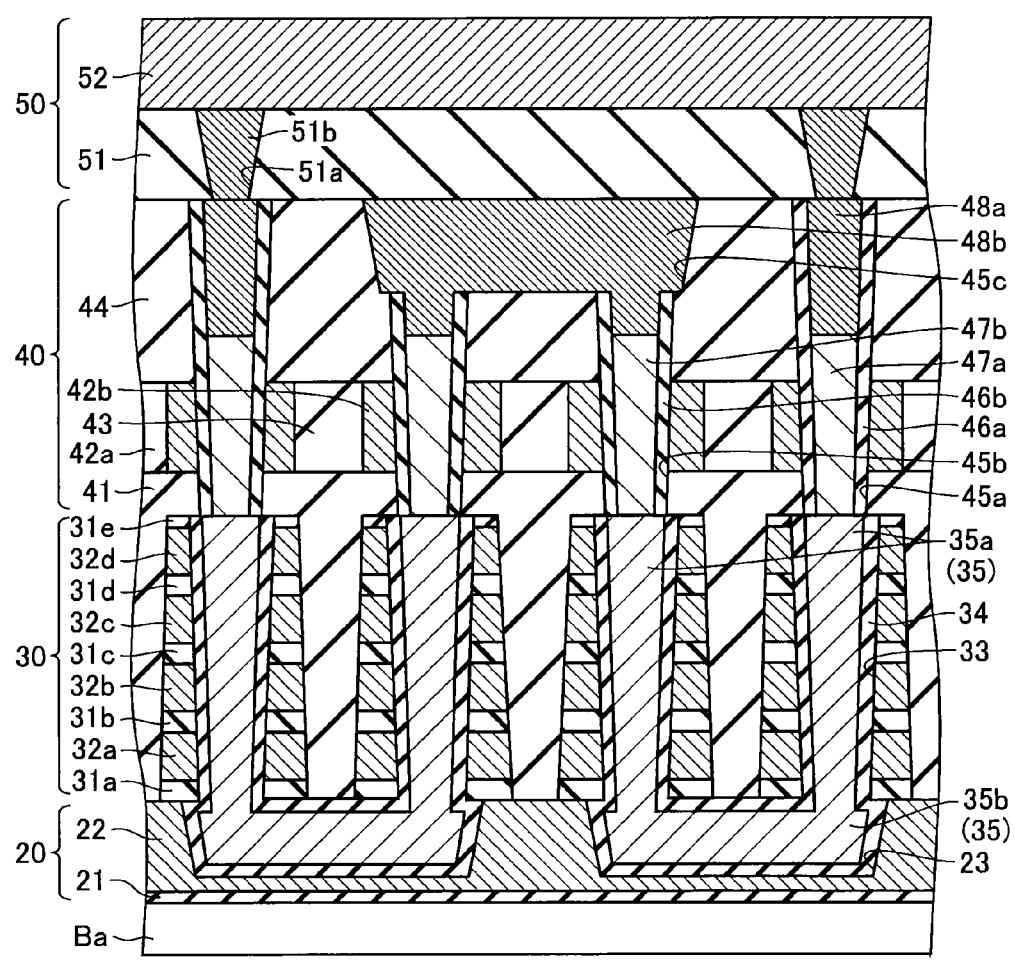
FIG. 5 is a cross-sectional view of the nonvolatile semiconductor memory device 100 in accordance with the first embodiment.

Next, a specific configuration of the nonvolatile semiconductor memory device 100 in accordance with the first embodiment is described with reference to FIG. 5. FIG. 5 is a cross-sectional view of the memory transistor region 12 of the nonvolatile semiconductor memory device 100 in accordance with the first embodiment.

The memory transistor region 12 includes, sequentially, from the semiconductor substrate Ba in the stacking direction, a back gate transistor layer 20, a memory transistor layer 30, a select transistor layer 40, and a wiring layer 50, as shown in FIG. 5. The back gate transistor layer 20 functions as the aforementioned back gate transistor BGTr. The memory transistor layer 30 functions as the aforementioned memory transistors MTr1-MTr8. The select transistor layer 40 functions as the aforementioned source side select transistor SSTr and drain side select transistor SDTr.

The back gate transistor layer 20 includes a back gate insulating layer 21 and a back gate conductive layer 22 that are sequentially stacked on the semiconductor substrate Ba. The back gate insulating layer 21 and the back gate conductive layer 22 are formed extending in the column direction and the row direction to extremities of the memory transistor region 12.

The back gate conductive layer 22 is formed covering a lower surface and a side surface of a joining portion 35b of a hereafter-described U-shaped semiconductor layer 35, and to a same height as an upper surface of the joining portion 35b.

The back gate insulating layer 21 is constituted by silicon oxide ($SiO_2$). The back gate conductive layer 22 is constituted by polysilicon (Si).

In addition, the back gate transistor layer 20 includes back gate holes 23 formed so as to dig out the back gate conductive layer 22. Each of the back gate holes 23 is configured to have an opening that is short in the row direction and long in the column direction. The back gate holes 23 are formed at predetermined intervals in the row direction and the column direction. That is to say, the back gate holes 23 are formed in a matrix in a plane that includes the row direction and the column direction.

The memory transistor layer 30 includes first through fifth inter-word line insulating layers 31a-31e, and first through fourth word line conductive layers 32a-32d, the layers 31a-31e, 32a-32d being alternately stacked above the back gate conductive layer 22.

The first through fifth inter-word line insulating layers 31a-31e and the first through fourth word line conductive layers 32a-32d are formed in a repeating manner in lines extending in the row direction and having a predetermined spacing in the column direction. The first through fifth inter-word line insulating layers 31a-31e and the first through fourth word line conductive layers 32a-32d are shaped into a stepped shape at ends in the row direction.

The first through fifth inter-word line insulating layers 31a-31e are constituted by silicon oxide ($SiO_2$). The first through fourth word line conductive layers 32a-32d are constituted by polysilicon (Si).

The memory transistor layer 30 includes memory holes 33 formed so as to penetrate the first through fifth inter-word line insulating layers 31a-31e and the first through fourth word line conductive layers 32a-32d. The memory holes 33 are formed so as to align with a position of a vicinity of both ends in the column direction of each of the back gate holes 23.

In addition, the above-described back gate transistor layer 20 and the memory transistor layer 30 include a memory gate insulating layer 34 and the U-shaped semiconductor layer 35. The memory gate insulating layer 34 is formed on a side wall of the first through fifth inter-word line insulating layers 31a-31e and the first through fourth word line conductive layers 32a-32d in the memory holes 33, and a side wall of the back gate conductive layer 22 in the back gate holes 23.

The U-shaped semiconductor layer 35 is formed in a U shape viewed from the row direction. The U-shaped semiconductor layer 35 is formed so as to be in contact with the memory gate insulating layer 34 and so as to fill the back gate hole 23 and the memory holes 33. The U-shaped semiconductor layer 35 includes a pair of columnar portions 35a extending in a perpendicular direction with respect to the semiconductor substrate Ba viewed from the row direction, and a joining portion 35b formed so as to join lower ends of the pair of columnar portions 35a.

The memory gate insulating layer 34 is constituted by silicon oxide ($SiO_2$)-silicon nitride (SiN)-silicon oxide ($SiO_2$). The U-shaped semiconductor layer 35 is constituted by polysilicon (Si) doped with phosphorus (P) (n type semiconductor). The U-shaped semiconductor layer 35 has an effective impurity concentration of $1 \times 10^{19}$ $cm^{-3}$ or more. Here, the effective impurity concentration is a concentration obtained by subtracting a p type impurity concentration from an n type impurity concentration.

In an above-described configuration of the back gate transistor layer 20 and the memory transistor layer 30, the back gate conductive layer 22 functions as a gate of the back gate transistor BGTr. The back gate conductive layer 22 functions as the back gate line BG. The first through fourth word line conductive layers 32a-32d function as gates of the memory transistors MTr1-MTr8. The first through fourth word line conductive layers 32a-32d function as the word lines WL1-WL8.

The select transistor layer 40 includes an interlayer insulating layer 41 deposited on the memory transistor layer 30, a drain side conductive layer 42a, a source side conductive layer 42b, a select transistor insulating layer 43, and an interlayer insulating layer 44. The interlayer insulating layer 41 is formed so as to be in contact with a side surface of the first through fifth inter-word line insulating layers 31a-31e and the first through fourth word line conductive layers 32a-32d. The drain side conductive layer 42a, the source side conductive layer 42b and the select transistor insulating layer 43 are formed in a repeating manner in lines extending in the row direction and having a predetermined spacing in the column direction.

The drain side conductive layer 42a is formed extending in the row direction and having a predetermined pitch in the column direction. Similarly, the source side conductive layer 42b is formed extending in the row direction and having a predetermined pitch in the column direction. A pair of the drain side conductive layers 42a and a pair of the source side conductive layers 42b are formed alternately in the column direction. The select transistor insulating layer 43 is formed between the drain side conductive layer 42a and the source side conductive layer 42b formed as described above. The interlayer insulating layer 44 is formed above the drain side conductive layer 42a, the source side conductive layer 42b and the select transistor insulating layer 43.

The drain side conductive layer 42a and the source side conductive layer 42b are constituted by polysilicon (Si) doped with boron (B) (p+ type semiconductor). The interlayer insulating layers 41 and 44, and the select transistor insulating layer 43 are constituted by silicon oxide ($SiO_2$).

In addition, the select transistor layer 40 includes drain side holes 45a, source side holes 45b, a source line wiring trench 45c, drain side gate insulating layers 46a, source side gate insulating layers 46b, drain side columnar semiconductor layers 47a, source side columnar semiconductor layers 47b, plug conductive layers 48a, and a source conductive layer 48b.

Each of the drain side holes 45a is formed so as to penetrate the interlayer insulating layer 44, the drain side conductive layer 42a, and the interlayer insulating layer 41. Each of the source side holes 45b is formed so as to penetrate the interlayer insulating layer 44, the source side conductive layer 42b, and the interlayer insulating layer 41. The drain side holes 45a and the source side holes 45b are formed at a position aligning with the memory holes 33. The source line wiring trench 45c is formed so as to dig out the interlayer insulating layer 44 at an upper portion of the source side holes 45b adjacent in the column direction. The source line wiring trench 45c is formed so as to connect the upper portion of the source side holes 45b adjacent in the column direction and so as to extend in the row direction.

The drain side gate insulating layer 46a is formed on a side wall of the interlayer insulating layer 41, the drain side conductive layer 42a and the interlayer insulating layer 44 in the drain side hole 45a. The source side gate insulating layer 46b is formed on a side wall of the interlayer insulating layer 41, the source side conductive layer 42b and the interlayer insulating layer 44 in the source side hole 45b. The drain side columnar semiconductor layer 47a is formed so as to be in contact with the drain side gate insulating layer 46a to a predetermined height within the drain side hole 45a. The source side columnar semiconductor layer 47b is formed so as to be in contact with the source side gate insulating layer 46b to a predetermined height within the source side hole 45b.

The plug conductive layer 48a is formed so as to fill the drain side hole 45a from the predetermined height within the drain side hole 45a to an upper surface of the select transistor layer 40. The source conductive layer 48b is formed so as to fill the source side holes 45b and the source line wiring trench 45c from the predetermined height within the source side holes 45b to the upper surface of the select transistor layer 40.

The drain side gate insulating layer 46a and the source side gate insulating layer 46b are constituted by silicon oxide ($SiO_2$). The drain side columnar semiconductor layer 47a and the source side columnar semiconductor layer 47b are constituted by polysilicon (Si) doped with a minute amount of phosphorus (P) (n type semiconductor) or by polysilicon (Si) not doped with any impurity (i type semiconductor). The drain side columnar semiconductor layer 47a and the source side columnar semiconductor layer 47b have an effective impurity concentration of $3 \times 10^{17}$ cm$^{-3}$ or less. That is to say, the effective impurity concentration of the drain side columnar semiconductor layer 47a and the source side columnar semiconductor layer 47b is lower than the effective impurity concentration of the U-shaped semiconductor layer 35. The plug conductive layer 48a and the source conductive layer 48b are constituted by titanium (Ti)-titanium nitride (TiN)-tungsten (W).

In the above-described configuration of the select transistor layer 40, the drain side conductive layer 42a functions as a gate of the drain side select transistor SDTr, and also as the drain side select gate line SGD. The source side conductive layer 42b functions as a gate of the source side select transistor SSTr, and also as the source side select gate line SGS. The source conductive layer 48b functions as the source line SL.

The wiring layer 50 includes an interlayer insulating layer 51, holes 51a, plug layers 51b, and a bit line layer 52. The interlayer insulating layer 51 is formed on the upper surface of the select transistor layer 40. The hole 51a is formed penetrating the interlayer insulating layer 51 at a position aligning with the drain side hole 45a. The plug layer 51b is formed to an upper surface of the interlayer insulating layer 51 so as to fill the hole 51a. The bit line layer 52 is formed in lines extending in the column direction with a predetermined pitch in the row direction so as to be in contact with an upper surface of the plug layer 51b.

The interlayer insulating layer 51 is constituted by silicon oxide (SiO2). The plug layer 51b and the bit line layer 52 are constituted by titanium (Ti)-titanium nitride (TiN)-tungsten (W).

In the above-described configuration of the wiring layer 50, the bit line layer 52 functions as the bit line BL.

(Method of Manufacturing the Nonvolatile Semiconductor Memory Device 100 in Accordance with the First Embodiment)

Next, a method of manufacturing the nonvolatile semiconductor memory device 100 in accordance with the first embodiment is described with reference to FIGS. 6-23. FIGS. 6-23 are cross-sectional views showing a manufacturing process of the nonvolatile semiconductor memory device 100 in accordance with the first embodiment.

Figure 6:
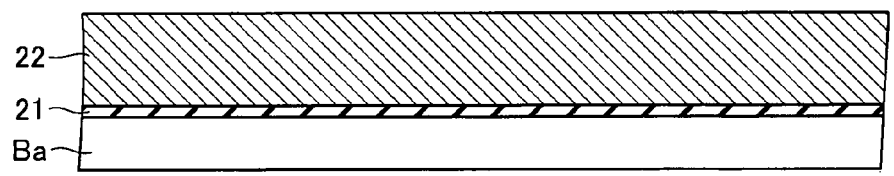
FIG. 6 is a cross-sectional view showing a manufacturing process of the nonvolatile semiconductor memory device 100 in accordance with the first embodiment.

First, silicon oxide ($SiO_2$) and polysilicon (Si) are deposited on the semiconductor substrate Ba to form the back gate insulating layer 21 and the back gate conductive layer 22, respectively, as shown in FIG. 6.

Figure 7:
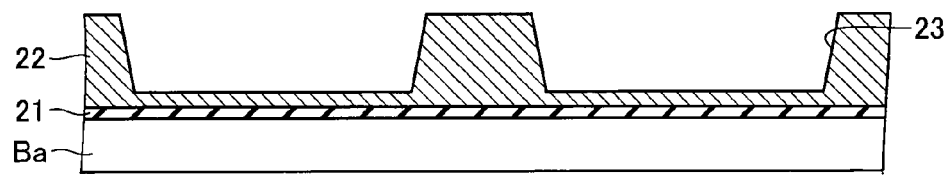
FIG. 7 is a cross-sectional view showing a manufacturing process of the nonvolatile semiconductor memory device 100 in accordance with the first embodiment.

Next, the back gate conductive layer 22 is dug out using methods of lithography or RIE (Reactive Ion Etching) to form the back gate holes 23, as shown in FIG. 7.

Figure 8:
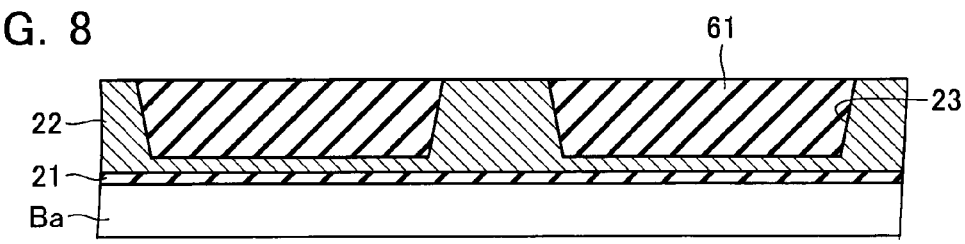
FIG. 8 is a cross-sectional view showing a manufacturing process of the nonvolatile semiconductor memory device 100 in accordance with the first embodiment.

Then, silicon nitride (SiN) is deposited so as to fill the back gate holes 23, thereby forming sacrifice layers 61, as shown in FIG. 8.

Figure 9:
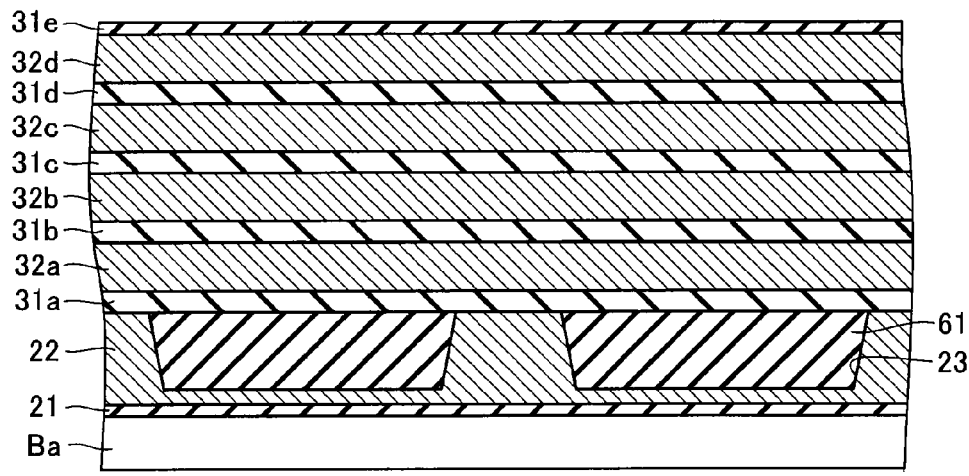
FIG. 9 is a cross-sectional view showing a manufacturing process of the nonvolatile semiconductor memory device 100 in accordance with the first embodiment.

Next, silicon oxide ($SiO_2$) and polysilicon (Si) are alternately deposited on the back gate conductive layer 22 and the sacrifice layers 61 to form the first through fifth inter-word line insulating layers 31a-31e and the first through fourth word line conductive layers 32a-32d, as shown in FIG. 9.

Figure 10:
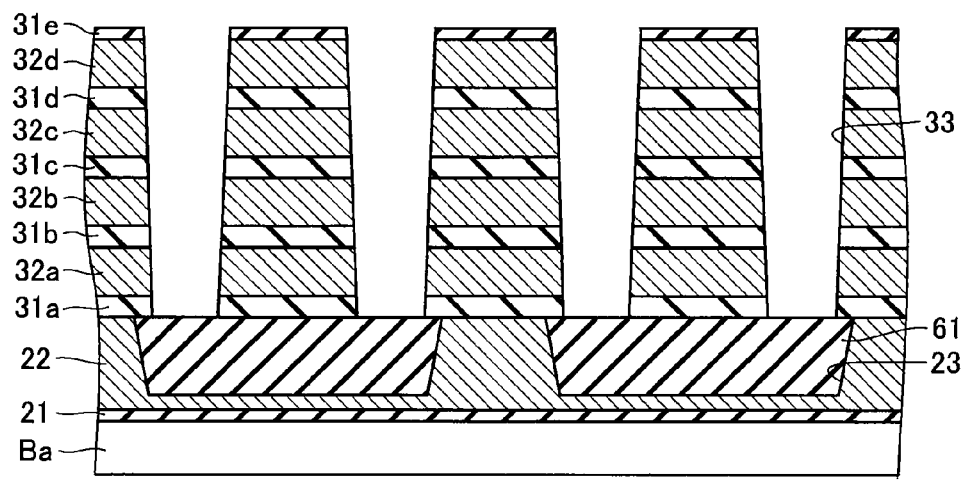
FIG. 10 is a cross-sectional view showing a manufacturing process of the nonvolatile semiconductor memory device 100 in accordance with the first embodiment.

Subsequently, the first through fifth inter-word line insulating layers 31a-31e and the first through fourth word line conductive layers 32a-32d are penetrated to form the memory holes 33, as shown in FIG. 10. The memory holes 33 are formed to reach an upper surface of both ends in the column direction of the sacrifice layers 61.

Figure 11:
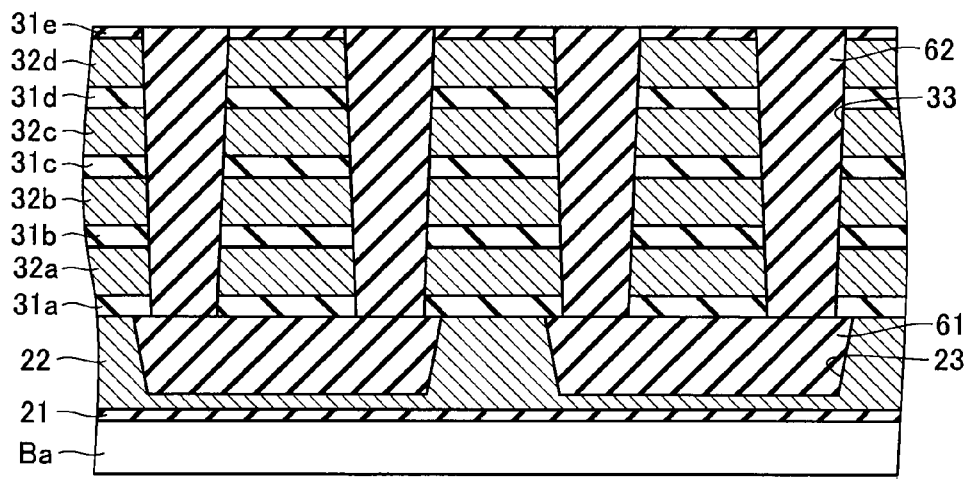
FIG. 11 is a cross-sectional view showing a manufacturing process of the nonvolatile semiconductor memory device 100 in accordance with the first embodiment.

Next, silicon nitride (SiN) is deposited so as to fill the memory holes 33, thereby forming sacrifice layers 62, as shown in FIG. 11.

Figure 12:
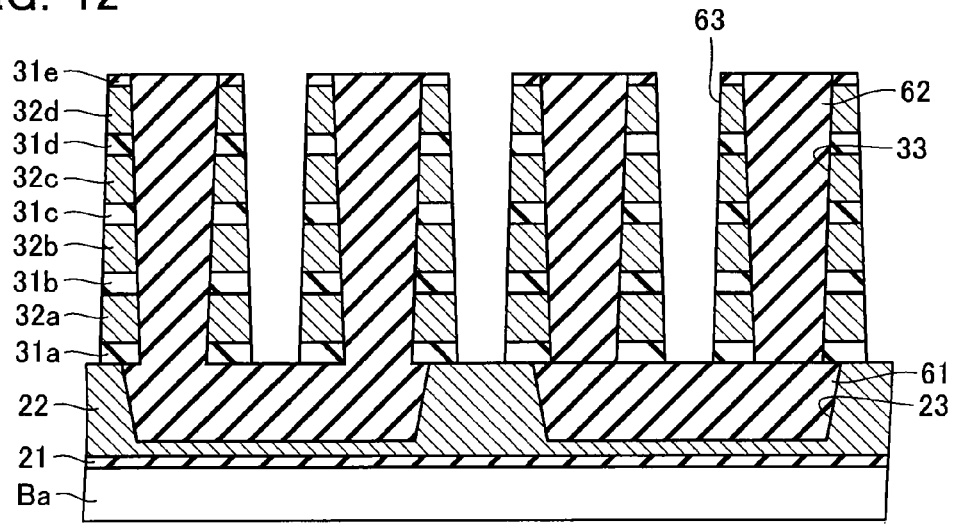
FIG. 12 is a cross-sectional view showing a manufacturing process of the nonvolatile semiconductor memory device 100 in accordance with the first embodiment.

Subsequently, the first through fifth inter-word line insulating layers 31a-31e and the first through fourth word line conductive layers 32a-32d are penetrated to form trenches 63, as shown in FIG. 12. The trenches 63 are formed between the memory holes 33 lined up in the column direction. The trenches 63 are formed so as to extend in the row direction.

Figure 13:
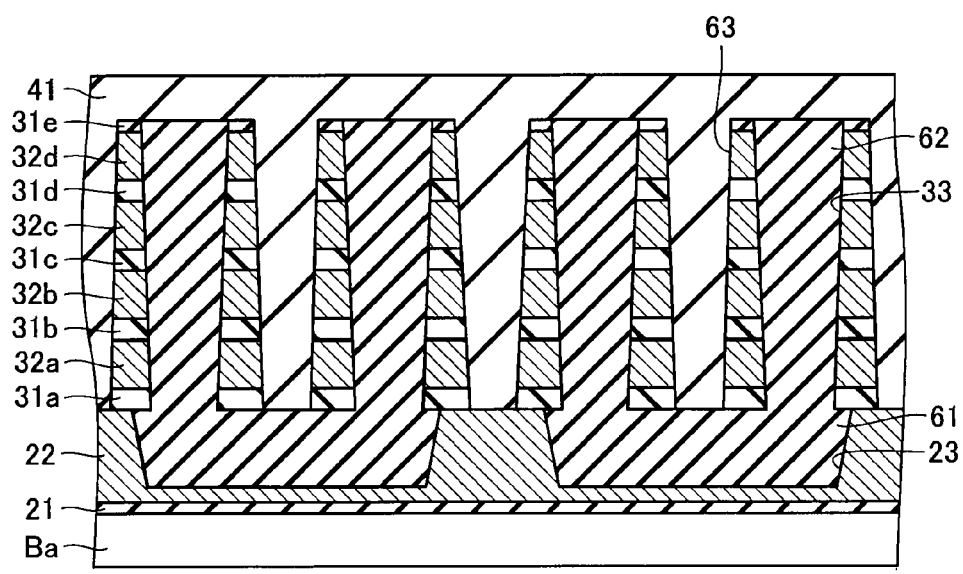
FIG. 13 is a cross-sectional view showing a manufacturing process of the nonvolatile semiconductor memory device 100 in accordance with the first embodiment.

Next, silicon oxide ($SiO_2$) is deposited so as to fill the trenches 63, thereby forming the interlayer insulating layer 41, as shown in FIG. 13.

Figure 14:
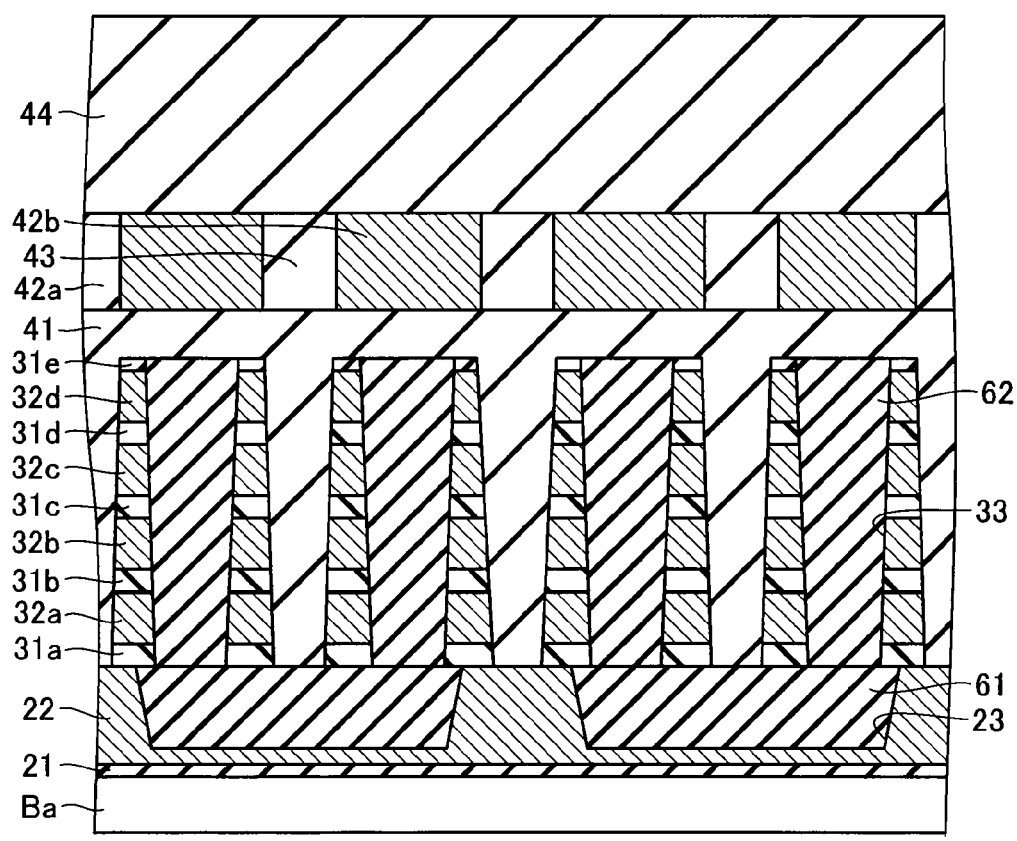
FIG. 14 is a cross-sectional view showing a manufacturing process of the nonvolatile semiconductor memory device 100 in accordance with the first embodiment.

Then, polysilicon (Si) and silicon oxide ($SiO_2$) are deposited on the interlayer insulating layer 41 to form the drain side conductive layers 42a, the source side conductive layers 42b, the select transistor insulating layers 43, and the interlayer insulating layer 44, as shown in FIG. 14. Here, the drain side conductive layers 42a, the source side conductive layers 42b, and the select transistor insulating layers 43 are formed so as to extend in the row direction with a predetermined pitch in the column direction. The drain side conductive layers 42a and the source side conductive layers 42b are formed such that pairs of the drain side conductive layers 42a and pairs of the source side conductive layers 42b are alternately arranged in the column direction.

Figure 15:
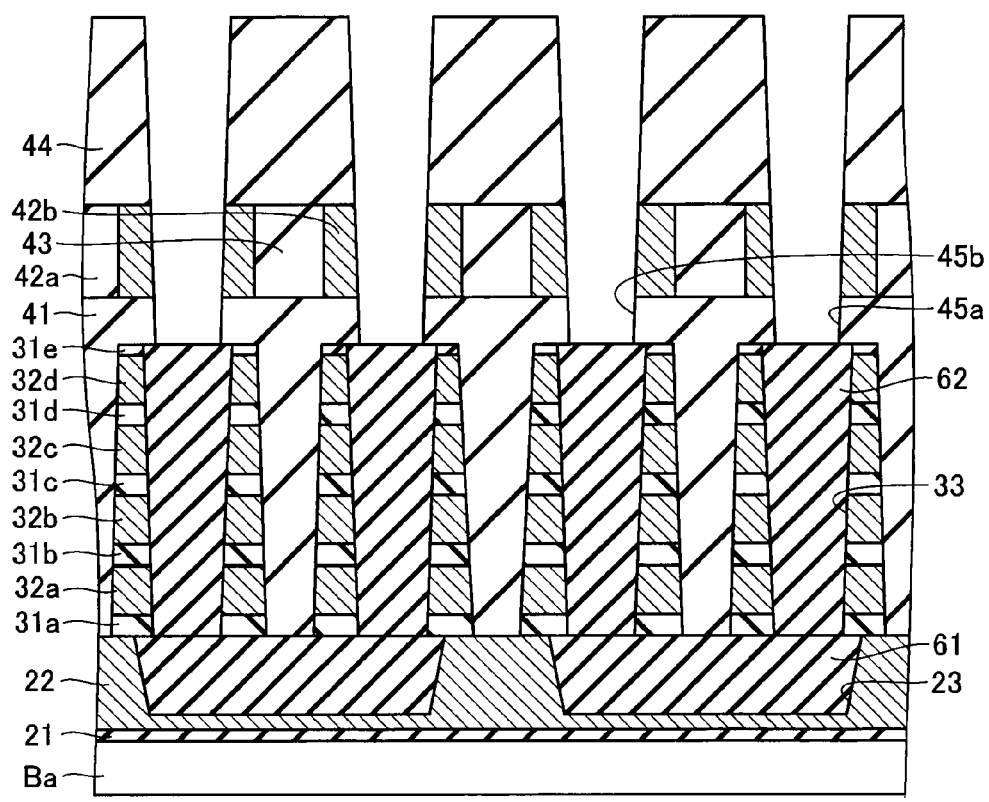
FIG. 15 is a cross-sectional view showing a manufacturing process of the nonvolatile semiconductor memory device 100 in accordance with the first embodiment.

Next, as shown in FIG. 15, the interlayer insulating layer 44, the drain side conductive layer 42a and the interlayer insulating layer 41 are penetrated to form the drain side holes 45a; further, the interlayer insulating layer 44, the source side conductive layer 42b and the interlayer insulating layer 41 are penetrated to form the source side holes 45b. The drain side holes 45a and the source side holes 45b are formed at a position aligning with the memory holes 33.

Figure 16:
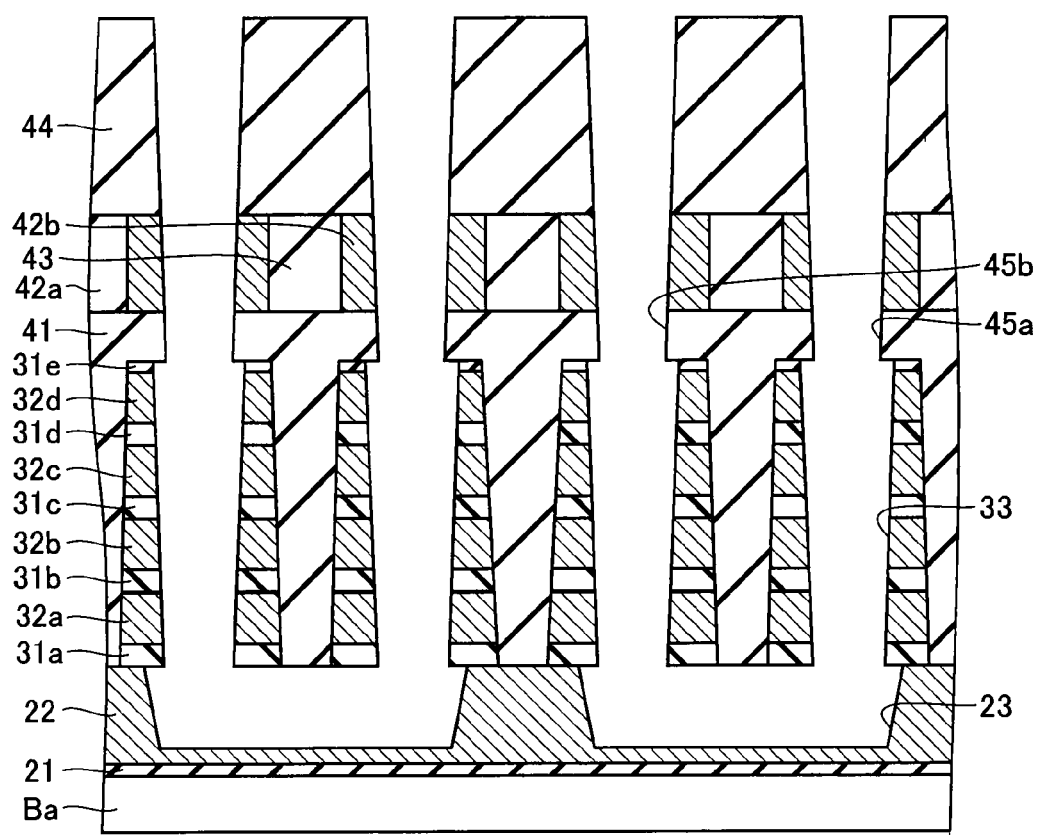
FIG. 16 is a cross-sectional view showing a manufacturing process of the nonvolatile semiconductor memory device 100 in accordance with the first embodiment.

Subsequently, the sacrifice layers 61 and 62 are removed with hot phosphoric acid solution, as shown in FIG. 16.

Figure 17:
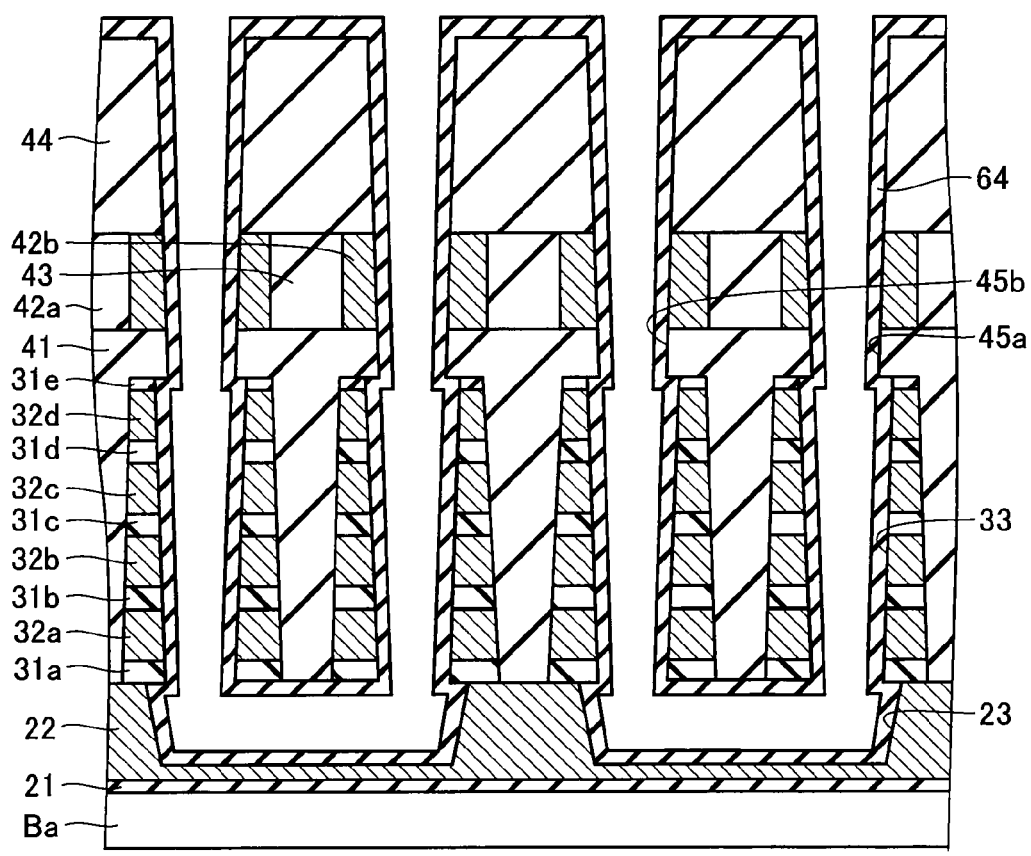
FIG. 17 is a cross-sectional view showing a manufacturing process of the nonvolatile semiconductor memory device 100 in accordance with the first embodiment.

Next, silicon oxide ($SiO_2$), silicon nitride (SiN), and silicon oxide ($SiO_2$) are deposited to form an ONO layer 64, as shown in FIG. 17. The ONO layer 64 is formed so as to cover a side surface of the back gate holes 23, the memory holes 33, the drain side holes 45a, and the source side holes 45b.

Figure 18:
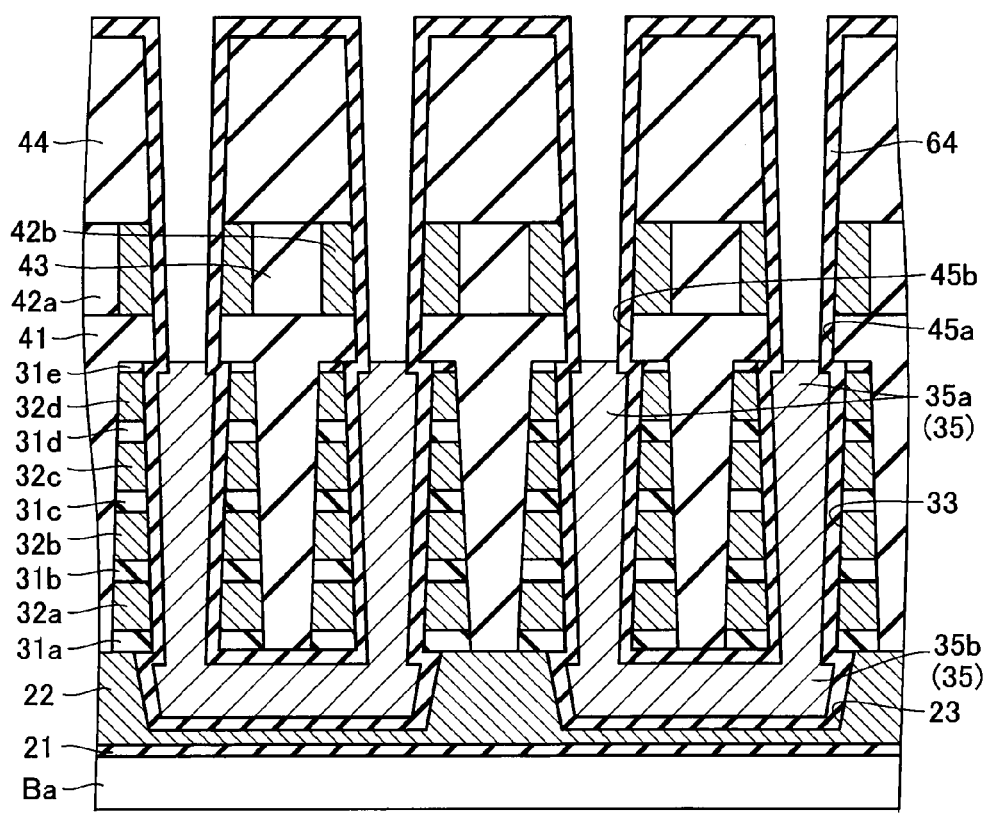
FIG. 18 is a cross-sectional view showing a manufacturing process of the nonvolatile semiconductor memory device 100 in accordance with the first embodiment.

Then, polysilicon (Si) is deposited in the memory holes 33 and the back gate holes 23, and doped with phosphorus (P), as shown in FIG. 18. Formed through these processes is the U-shaped semiconductor layer 35. Here, the effective impurity concentration of the U-shaped semiconductor layer 35 is set to $1\times10^{19}$ cm$^{-3}$ or more.

Figure 19:
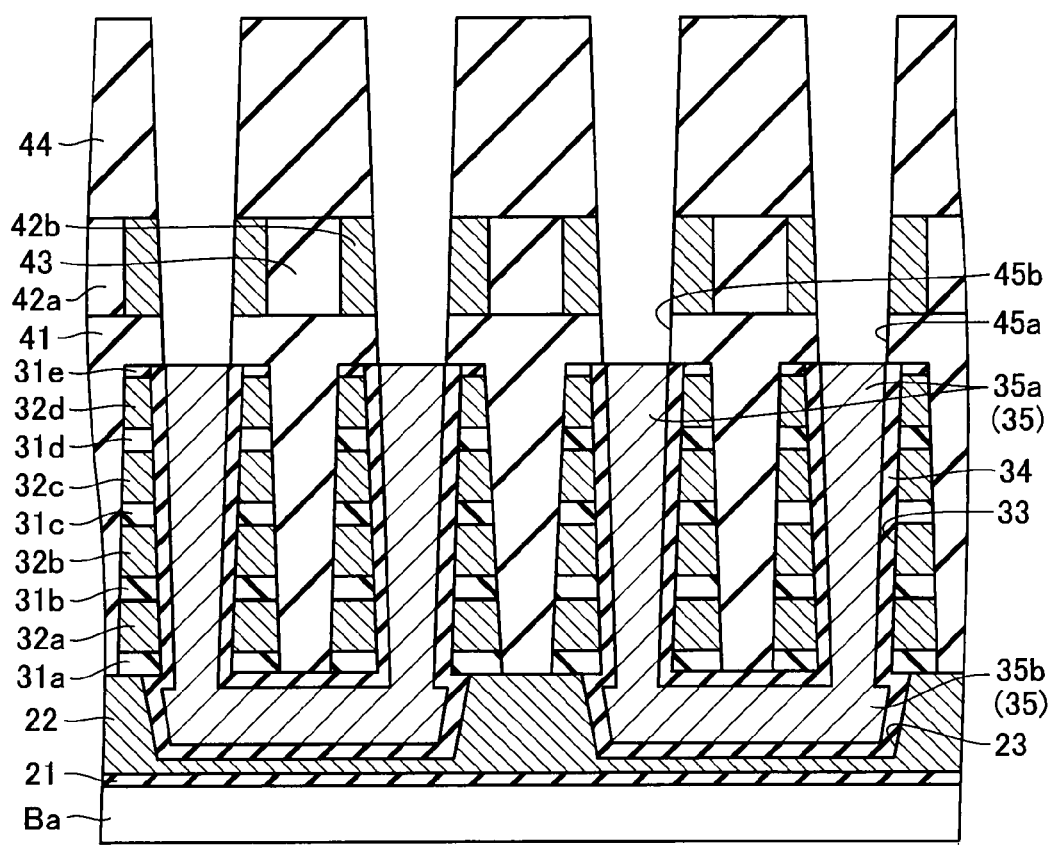
FIG. 19 is a cross-sectional view showing a manufacturing process of the nonvolatile semiconductor memory device 100 in accordance with the first embodiment.

Next, the ONO layer 64 formed in the drain side holes 45a and the source side holes 45b is removed, as shown in FIG. 19. Through this process, the ONO layer 64 left remaining in the memory holes 33 and the back gate holes 23 becomes the memory gate insulating layer 34.

Figure 20:
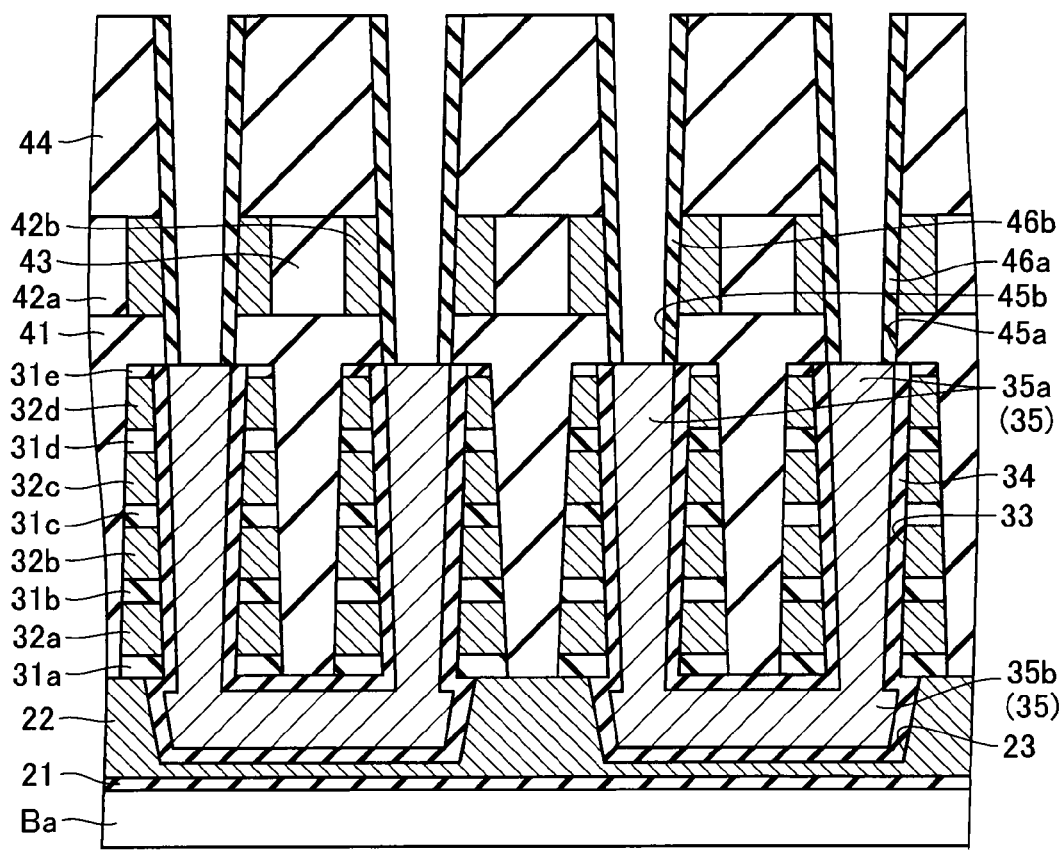
FIG. 20 is a cross-sectional view showing a manufacturing process of the nonvolatile semiconductor memory device 100 in accordance with the first embodiment.

Subsequently, silicon oxide ($SiO_2$) is deposited on side walls in the drain side holes 45a and the source side holes 45b to form the drain side gate insulating layers 46a and the source side gate insulating layers 46b, as shown in FIG. 20.

Figure 21:
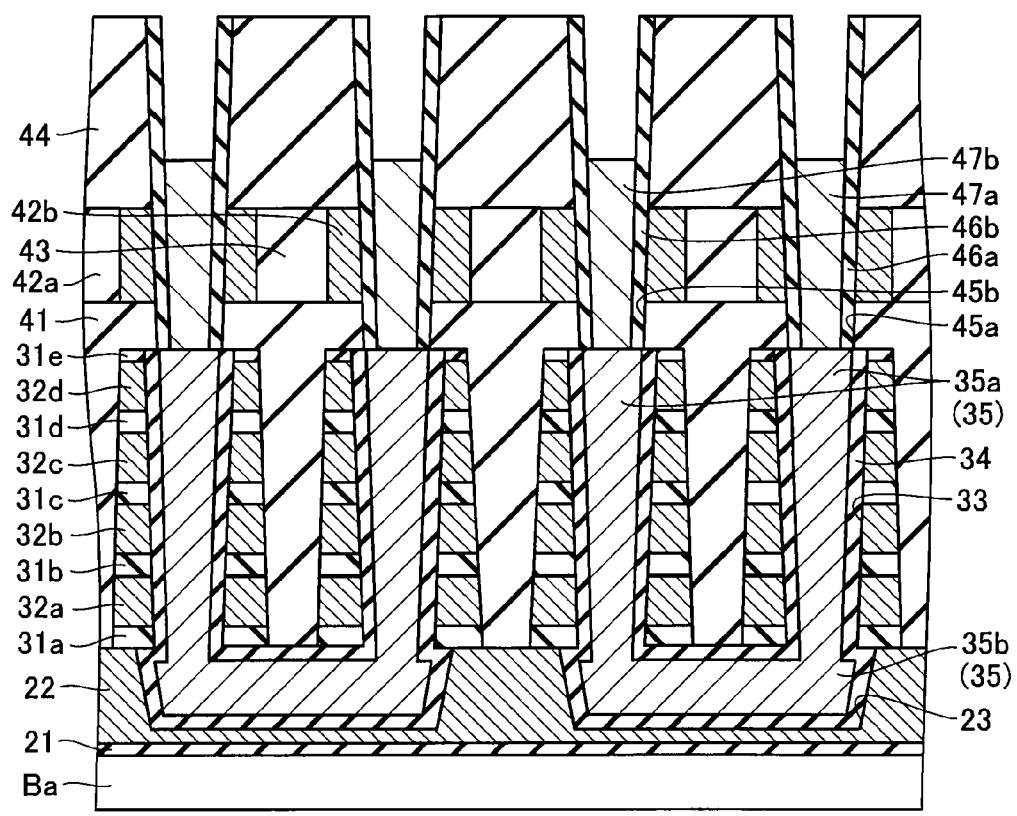
FIG. 21 is a cross-sectional view showing a manufacturing process of the nonvolatile semiconductor memory device 100 in accordance with the first embodiment.

Next, polysilicon (Si) is deposited to a predetermined height in the drain side holes 45a and the source side holes 45b, and doped with phosphorus (P), as shown in FIG. 21. Formed through these processes are the drain side columnar semiconductor layers 47a and the source side columnar semiconductor layers 47b. Here, the effective impurity concentration of the drain side columnar semiconductor layer 47a and the source side columnar semiconductor layer 47b is set to $3\times10^{17}$ cm$^{-3}$ or less. That is to say, the effective impurity concentration of the drain side columnar semiconductor layer 47a and the source side columnar semiconductor layer 47b is set to be less than or equal to the effective impurity concentration of the U-shaped semiconductor layer 35.

Figure 22:
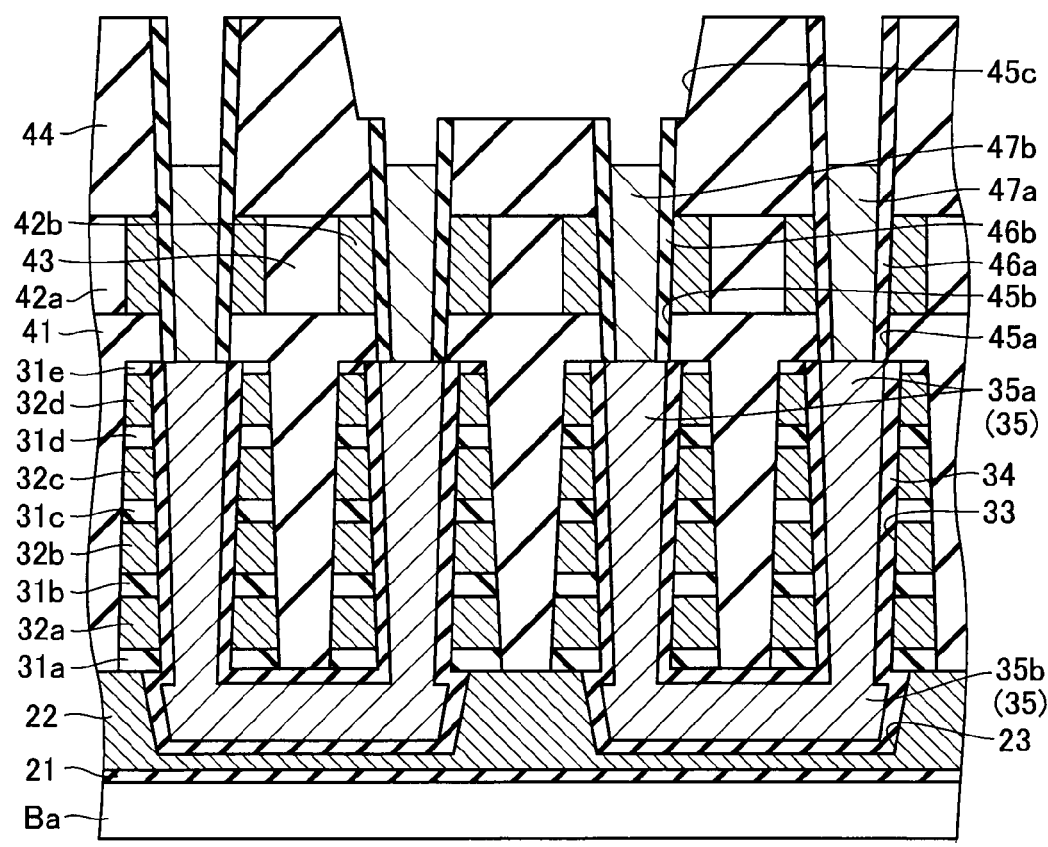
FIG. 22 is a cross-sectional view showing a manufacturing process of the nonvolatile semiconductor memory device 100 in accordance with the first embodiment.

Then, the interlayer insulating layer 44 is dug out so as to join in the column direction the upper portion of each of the source side holes 45b adjacent in the column direction, thereby forming the source line wiring trench 45c, as shown in FIG. 22. The source line wiring trench 45c is formed so as to have a rectangular opening that is short in the column direction and long in the row direction.

Figure 23:
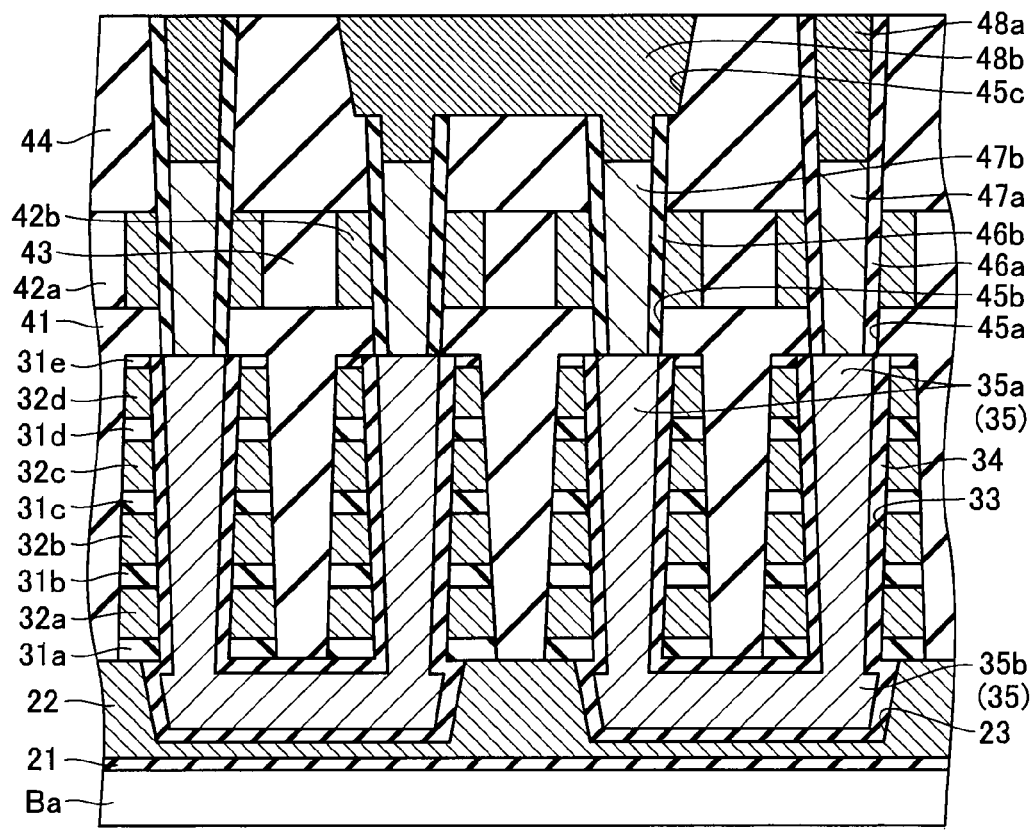
FIG. 23 is a cross-sectional view showing a manufacturing process of the nonvolatile semiconductor memory device 100 in accordance with the first embodiment.

Next, titanium (Ti)-titanium nitride (TiN)-tungsten (W) is deposited so as to fill the drain side holes 45a, the source side holes 45b, and the source line wiring trench 45c, thereby forming the plug layers 48a and the source line conductive layer 48b, as shown in FIG. 23.

Subsequently, the wiring layer 50 is formed, thereby forming the nonvolatile semiconductor memory device 100 shown in FIG. 5.

(Advantage of the Nonvolatile Semiconductor Memory Device 100 in Accordance with the First Embodiment)

Next, an advantage of the nonvolatile semiconductor memory device 100 in accordance with the first embodiment is described. The nonvolatile semiconductor memory device 100 in accordance with the first embodiment is capable of a high degree of integration as shown in the above-described stacking structure.

In the nonvolatile semiconductor memory device 100, the effective impurity concentration of the drain side columnar semiconductor layer 47a and the source side columnar semiconductor layer 47b is smaller than the effective impurity concentration of the U-shaped semiconductor layer 35. Consequently, in the nonvolatile semiconductor memory device 100, a parasitic resistance between gates of the memory transistors MTr1-MTr8 (between the first through fourth word line conductive layers 32a-32d) can be reduced, and a cell current during read can be increased. Moreover, in the nonvolatile semiconductor memory device 100, a generation recombination current can be reduced, and drain side select transistors SDTr and source side select transistors SSTr can be configured that have a good cutoff characteristic.

In addition, the effective impurity concentration of the drain side columnar semiconductor layer 47a and the source side columnar semiconductor layer 47b is $3\times10^{17}$ cm$^{-3}$ or less, and the effective impurity concentration of the U-shaped semiconductor layer 35 is $1\times10^{19}$ cm$^{-3}$ or more. Now, it is known generally that a carrier density in a polysilicon layer changes sharply at a boundary effective impurity concentration of about $1\times10^{18}$ cm$^{-3}$. That is to say, in the nonvolatile semiconductor memory device 100 in accordance with the first embodiment, the effective impurity concentration of the drain side columnar semiconductor layer 47a and the source side columnar semiconductor layer 47b, and the effective impurity concentration of the U-shaped semiconductor layer 35 are configured so as to avoid an effective impurity concentration of $1\times10^{18}$ cm$^{-3}$. Consequently, even in a case that there occurs a slight variation in the effective impurity concentration at a time of manufacturing the nonvolatile semiconductor memory device 100 in accordance with the first embodiment, the carrier density is not greatly changed. Yield of the nonvolatile semiconductor memory device 100 in accordance with the first embodiment can be improved.

Furthermore, the nonvolatile semiconductor memory device 100 includes the drain side conductive layers 42a and the source side conductive layers 42b constituted by polysilicon (Si) doped with boron (B) (p+ type semiconductor). Consequently, in the nonvolatile semiconductor memory device 100 in accordance with the first embodiment, a threshold voltage of the drain side select transistors SDTr and the source side select transistors SSTr can be set positive. As a result, the source side select gate line drive circuit 14 and the drain side select gate line drive circuit 15 can be simplified.

Second Embodiment (Specific Configuration of a Nonvolatile Semiconductor Memory Device in Accordance with a Second Embodiment)

Figure 24:
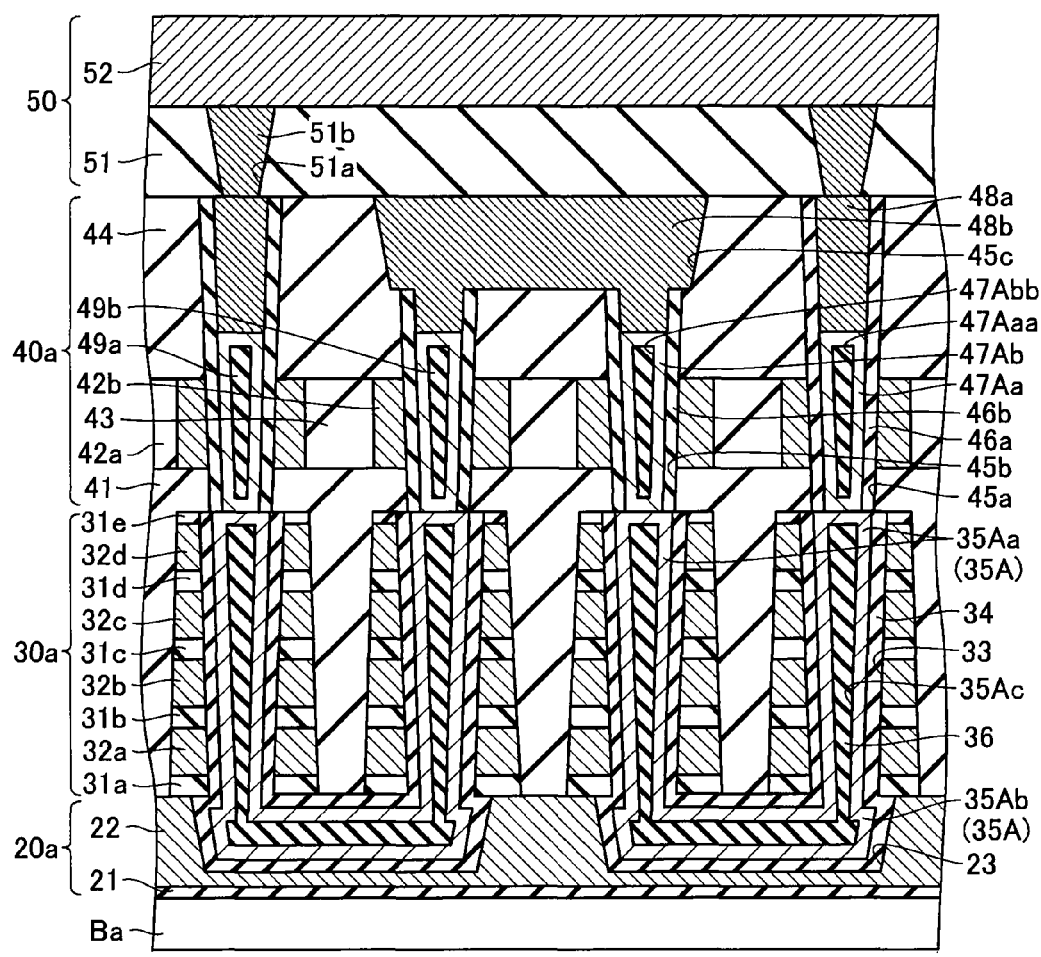
FIG. 24 is a cross-sectional view of a nonvolatile semiconductor memory device in accordance with a second embodiment.

Next, a specific configuration of a nonvolatile semiconductor memory device in accordance with a second embodiment is described with reference to FIG. 24. FIG. 24 is a cross-sectional view of a memory transistor region 12 of the nonvolatile semiconductor memory device in accordance with the second embodiment. Note that in the second embodiment, identical symbols are assigned to configurations similar to those in the first embodiment and descriptions thereof are omitted.

As shown in FIG. 24, the nonvolatile semiconductor memory device in accordance with the second embodiment includes a back gate transistor layer 20a, a memory transistor layer 30a, and a select transistor layer 40a, which differ from those of the first embodiment.

The back gate transistor layer 20a and the memory transistor layer 30a include a U-shaped semiconductor layer 35A which differs from that of the first embodiment. The back gate transistor layer 20a and the memory transistor layer 30a further include an internal insulating layer 36.

The U-shaped semiconductor layer 35A is formed in a U shape and includes a pair of columnar portions 35Aa and a joining portion 35Ab formed so as to join lower ends of the pair of columnar portions 35Aa, similarly to the first embodiment. At the same time, the U-shaped semiconductor layer 35A differs from the first embodiment in including a hollow 35Ac communicating from an upper end of one of the columnar portions 35Aa to an upper end of another of the columnar portions 35Aa via the joining portion 35Ab.

The internal insulating layer 36 is formed so as to fill the hollow 35Ac. The internal insulating layer 36 is constituted by silicon oxide ($SiO_2$).

The select transistor layer 40a includes a drain side columnar semiconductor layer 47Aa and a source side columnar semiconductor layer 47Ab which differ from those of the first embodiment. The select transistor layer 40a further includes internal insulating layers 49a and 49b.

The drain side columnar semiconductor layer 47Aa is formed in a column shape, similarly to the first embodiment. At the same time, the drain side columnar semiconductor layer 47Aa differs from the first embodiment in including from an upper end to a lower end thereof a hollow 47Aaa. The source side columnar semiconductor layer 47Ab is formed in a column shape, similarly to the first embodiment. At the same time, the source side columnar semiconductor layer 47Ab differs from the first embodiment in including from an upper end to a lower end thereof a hollow 47Abb.

The internal insulating layer 49a is formed in the hollow 47Aaa of the drain side columnar semiconductor layer 47Aa. The internal insulating layer 49b is formed in the hollow 47Abb of the source side columnar semiconductor layer 47Ab. The internal insulating layers 49a and 49b are constituted by silicon oxide ($SiO_2$).

(Method of Manufacturing the Nonvolatile Semiconductor Memory Device in Accordance with the Second Embodiment)

Next, a method of manufacturing the nonvolatile semiconductor memory device in accordance with the second embodiment is described with reference to FIGS. 25-29. FIGS. 25-29 are cross-sectional views showing a manufacturing process of the nonvolatile semiconductor memory device in accordance with the second embodiment.

Figure 25:
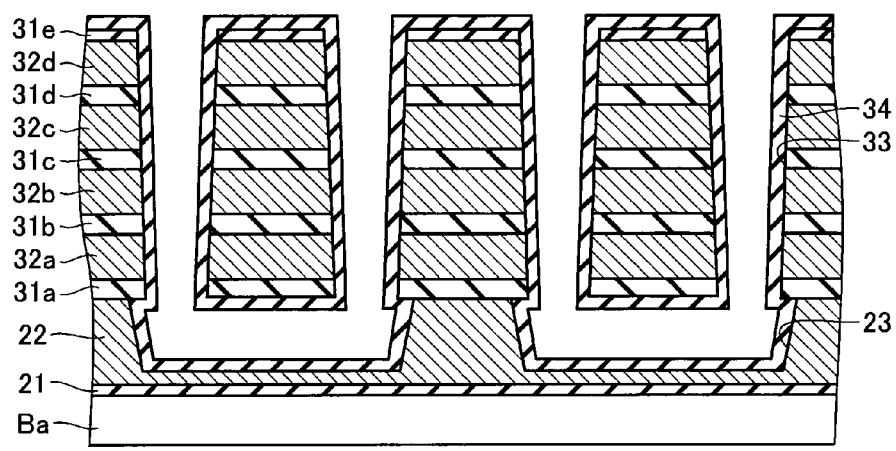
FIG. 25 is a cross-sectional view showing a manufacturing process of the nonvolatile semiconductor memory device in accordance with the second embodiment.

First, processes are executed up to and including those shown in FIGS. 6-10 of the first embodiment. Next, the sacrifice layer 61 shown in FIG. 10 is removed with hot phosphoric acid solution to form the back gate hole 23 and the memory holes 33. Then, silicon oxide ($SiO_2$), silicon nitride (SiN), and silicon oxide ($SiO_2$) are deposited to form the memory gate insulating layer 34, as shown in FIG. 25. The memory gate insulating layer 34 is formed so as to cover a side surface in the back gate hole 23 and the memory holes 33.

Figure 26:
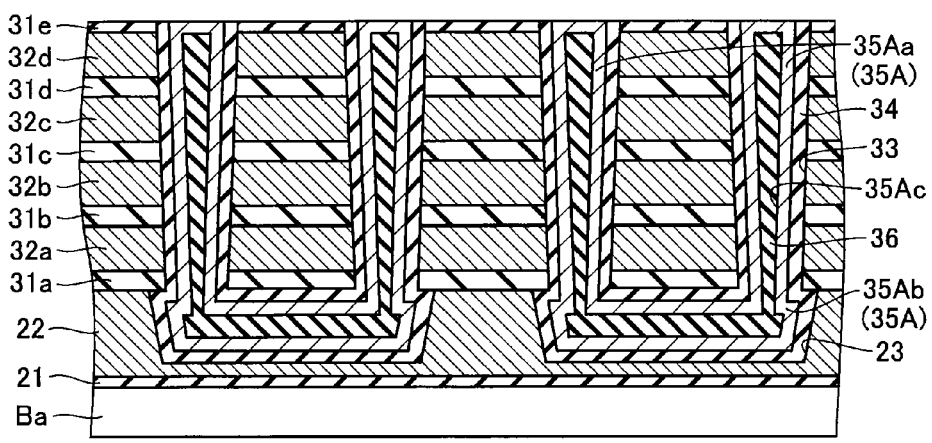
FIG. 26 is a cross-sectional view showing a manufacturing process of the nonvolatile semiconductor memory device in accordance with the second embodiment.

Next, polysilicon (Si) is formed on a side wall in the back gate hole 23 and the memory holes 33, and doped with phosphorus (P), as shown in FIG. 26. Formed through this process is the U-shaped semiconductor layer 35A having the hollow 35Ac. Then, silicon oxide ($SiO_2$) is deposited so as to fill the back gate hole 23 and the memory holes 33, thereby forming the internal insulating layer 36 in the hollow 35Ac of the U-shaped semiconductor layer 35A. In addition, subsequent to etching back the internal insulating layer 36, polysilicon is deposited and an upper portion thereof is planarized, thereby forming at an upper portion of the memory holes 33 (the internal insulating layer 36) a covering layer configured to seal the hollow 35Ac.

Figure 27:
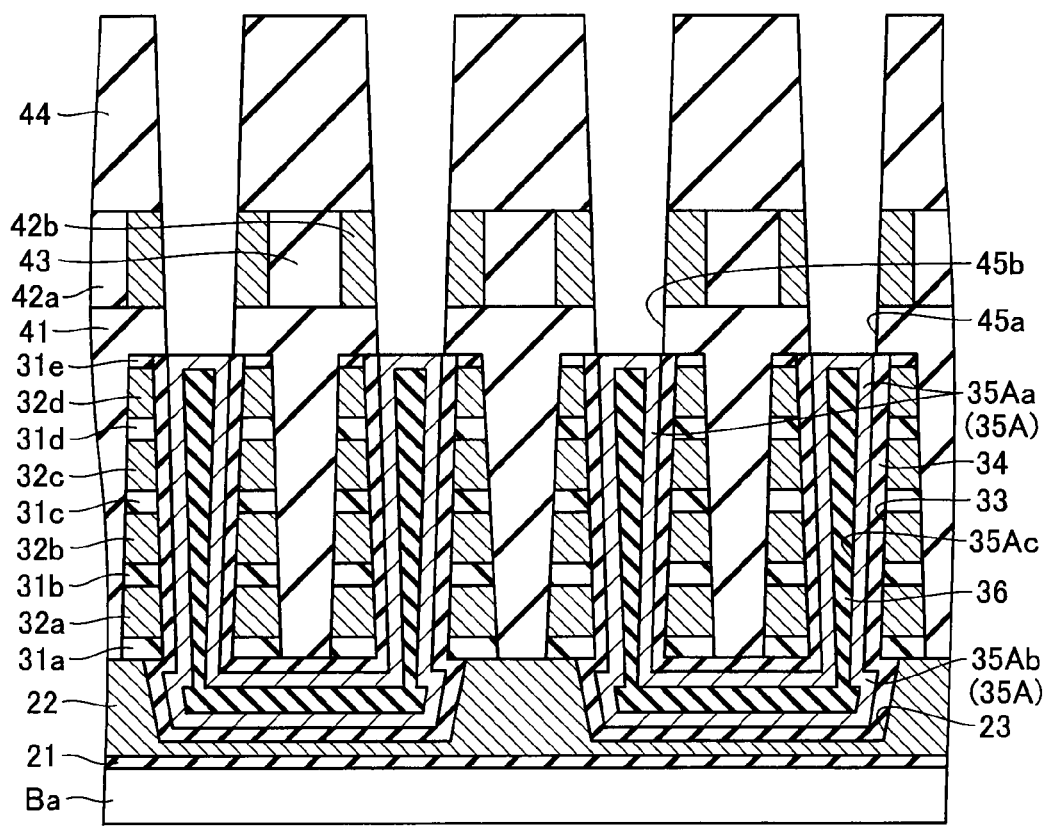
FIG. 27 is a cross-sectional view showing a manufacturing process of the nonvolatile semiconductor memory device in accordance with the second embodiment.

Subsequently, processes similar to those in FIGS. 14 and 15 of the first embodiment are executed, thereby forming the drain side holes 45a so as to penetrate the interlayer insulating layer 44, the drain side conductive layer 42a and the interlayer insulating layer 41; and the source side holes 45b so as to penetrate the interlayer insulating layer 44, the source side conductive layer 42b and the interlayer insulating layer 41, as shown in FIG. 27. Here, the drain side holes 45a and the source side holes 45b are formed at a position aligning with the memory holes 33.

Figure 28:
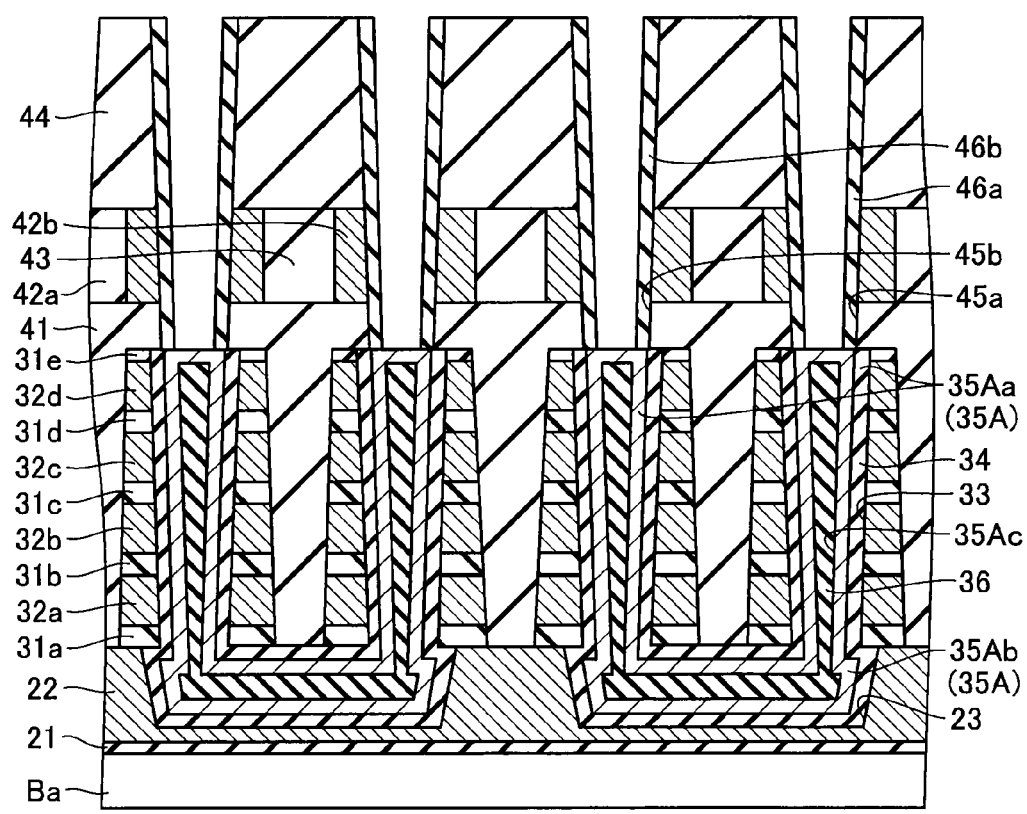
FIG. 28 is a cross-sectional view showing a manufacturing process of the nonvolatile semiconductor memory device in accordance with the second embodiment.

Next, silicon oxide ($SiO_2$) is deposited on a side surface in the drain side holes 45a and the source side holes 45b to form the drain side gate insulating layers 46a and the source side gate insulating layers 46b, as shown in FIG. 28.

Figure 29:
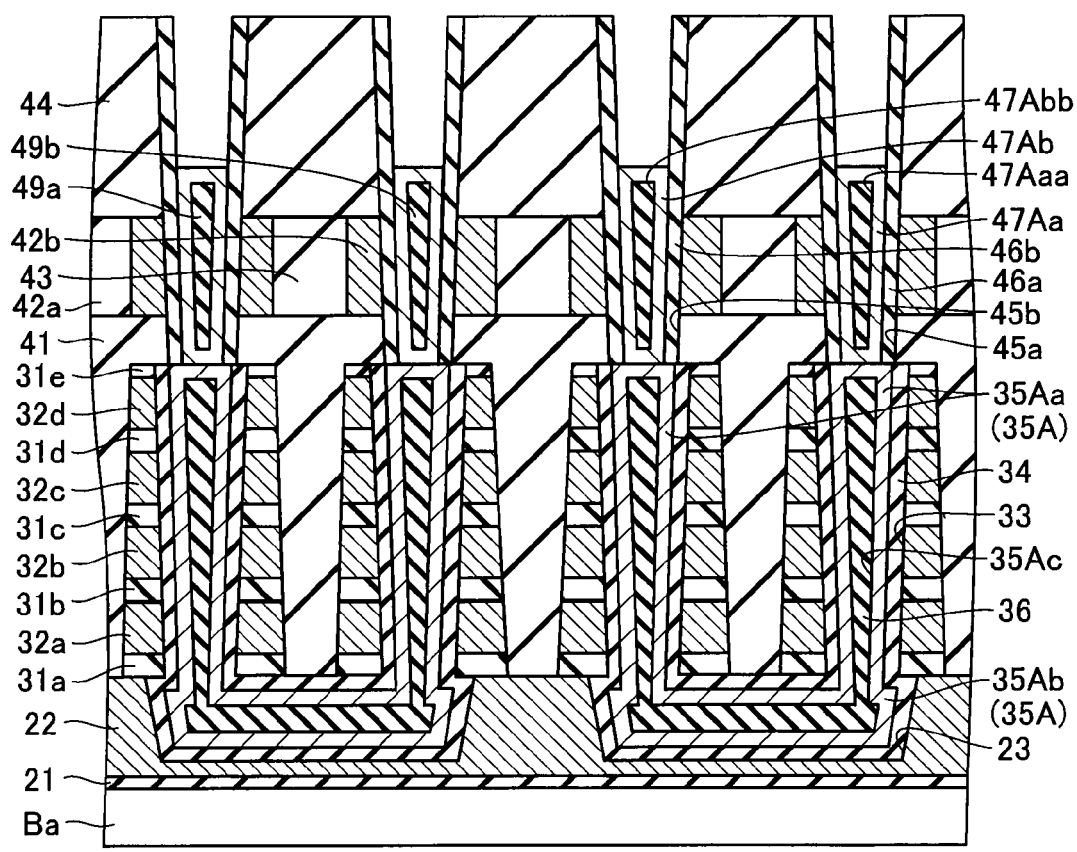
FIG. 29 is a cross-sectional view showing a manufacturing process of the nonvolatile semiconductor memory device in accordance with the second embodiment.

Subsequently, as shown in FIG. 29, polysilicon (Si) is formed (to a predetermined height) on a side wall in the drain side holes 45a and the source side holes 45b, and doped with phosphorus (P). Formed through this process are the drain side columnar semiconductor layer 47Aa that has the hollow 47Aaa, and the source side columnar semiconductor layer 47Ab that has the hollow 47Abb. Then, silicon oxide ($SiO_2$) is deposited to the predetermined height of the drain side holes 45a and the source side holes 45b, thereby forming the internal insulating layer 49a in the hollow 47Aaa of the drain side columnar semiconductor layer 47Aa; and the internal insulating layer 49b in the hollow 47Abb of the source side columnar semiconductor layer 47Ab. In addition, subsequent to etching back the internal insulating layers 49a and 49b, polysilicon is deposited and an upper portion thereof is planarized, thereby forming at an upper portion of the drain side holes 45a (the internal insulating layer 49a) and the source side holes 45b (the internal insulating layer 49b) a covering layer configured to seal the hollows 47Aaa and 47Abb. Then, subsequent to executing the processes shown in FIGS. 22 and 23 of the first embodiment, the wiring layer 50 is formed, thereby forming the nonvolatile semiconductor memory device shown in FIG. 24.

(Advantage of the Nonvolatile Semiconductor Memory Device in Accordance with the Second Embodiment)

Next, an advantage of the nonvolatile semiconductor memory device in accordance with the second embodiment is described. The nonvolatile semiconductor memory device in accordance with the second embodiment has a configuration substantially similar to that of the first embodiment. Consequently, the nonvolatile semiconductor memory device in accordance with the second embodiment has the same advantages as that of the first embodiment.

In addition, in the nonvolatile semiconductor memory device in accordance with the second embodiment, the U-shaped semiconductor layer 35A, the drain side columnar semiconductor layer 47Aa, and the source side columnar semiconductor layer 47Ab are formed to include the hollows 35Ac, 47Aaa, and 47Abb, respectively. This configuration allows the U-shaped semiconductor layer 35A, the drain side columnar semiconductor layer 47Aa, and the source side columnar semiconductor layer 47Ab to be formed with a uniform thickness, irrespective of a diameter of the back gate hole 23, a diameter of the memory holes 33, and a diameter of the drain side holes 45a and the source side holes 45b. In other words, a characteristic of the memory transistors MTr1-MTr8, the drain side select transistor SDTr, and the source side select transistor SSTr can be maintained, unaffected by variations in opening diameter during manufacture of the nonvolatile semiconductor memory device 100 in accordance with the first embodiment.

Third Embodiment (Specific Configuration of a Nonvolatile Semiconductor Memory Device in Accordance with a Third Embodiment)

Figure 30:
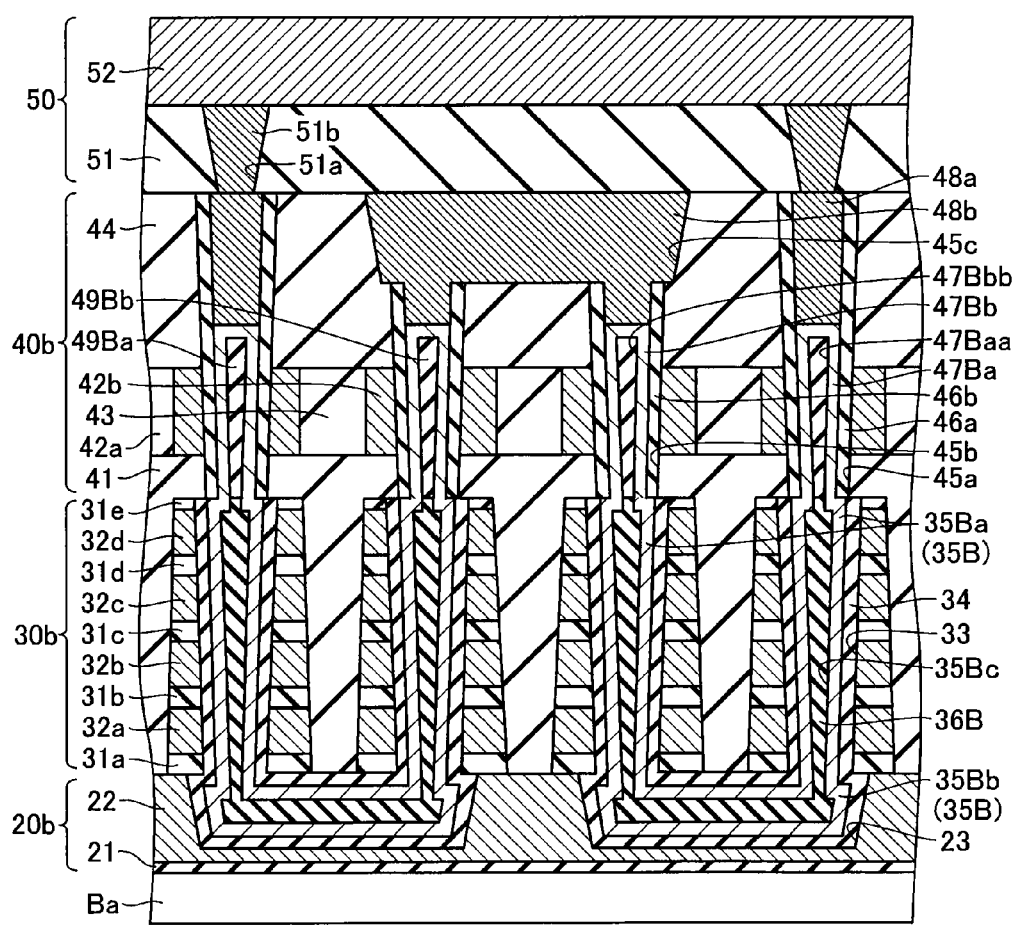
FIG. 30 is a cross-sectional view of a nonvolatile semiconductor memory device in accordance with a third embodiment.

Next, a specific configuration of a nonvolatile semiconductor memory device in accordance with a third embodiment is described with reference to FIG. 30. FIG. 30 is a cross-sectional view of a memory transistor region 12 of the nonvolatile semiconductor memory device in accordance with the third embodiment. Note that in the third embodiment, identical symbols are assigned to configurations similar to those in the first and second embodiments and descriptions thereof are omitted.

As shown in FIG. 30, the nonvolatile semiconductor memory device in accordance with the third embodiment includes a back gate transistor layer 20b, a memory transistor layer 30b, and a select transistor layer 40b, which differ from those of the first and second embodiments.

The back gate transistor layer 20b, the memory transistor layer 30b, and the select transistor layer 40b include a U-shaped semiconductor layer 35B, an internal insulating layer 36B, a drain side columnar semiconductor layer 47Ba, a source side columnar semiconductor layer 47Bb, and internal insulating layers 49Ba and 49Bb, which differ from those of the second embodiment.

The U-shaped semiconductor layer 35B, the drain side columnar semiconductor layer 47Ba, and the source side columnar semiconductor layer 47Bb are formed continuously in an integrated manner. The U-shaped semiconductor layer 35B includes a hollow 35Bc, the drain side columnar semiconductor layer 47Ba includes a hollow 47Baa, and the source side columnar semiconductor layer 47Bb includes a hollow 47Bbb. The hollow 35Bc, the hollow 47Baa, and the hollow 47Bbb are formed so as to communicate with each other. Note that the hollow 35Bc of the U-shaped semiconductor layer 35B is formed so as to be in communication from an upper end of one of columnar portions 35Ba to an upper end of another of the columnar portions 35Ba via a joining portion 35Bb.

The effective impurity concentration of the U-shaped semiconductor layer 35B is $1 \times 10^{19}$ cm$^{-3}$ or more, and the effective impurity concentration of the drain side columnar semiconductor layer 47Ba and the source side columnar semiconductor layer 47Bb is $3 \times 10^{17}$ cm$^{-3}$ or less, similarly to the first and second embodiments.

The internal insulating layer 36B is formed in the hollow 35Bc of the U-shaped semiconductor layer 35B. The internal insulating layer 36B is constituted by silicon oxide (SiO$_2$).

The internal insulating layer 49Ba is formed in the hollow 47Baa of the drain side columnar semiconductor layer 47Ba. The internal insulating layer 49Bb is formed in the hollow 47Bbb of the source side columnar semiconductor layer 47Bb. The internal insulating layers 49Ba and 49Bb are constituted by BSG (silicon oxide (SiO$_2$) doped with boron (B)).

(Method of Manufacturing the Nonvolatile Semiconductor Memory Device in Accordance with the Third Embodiment)

Figure 31:
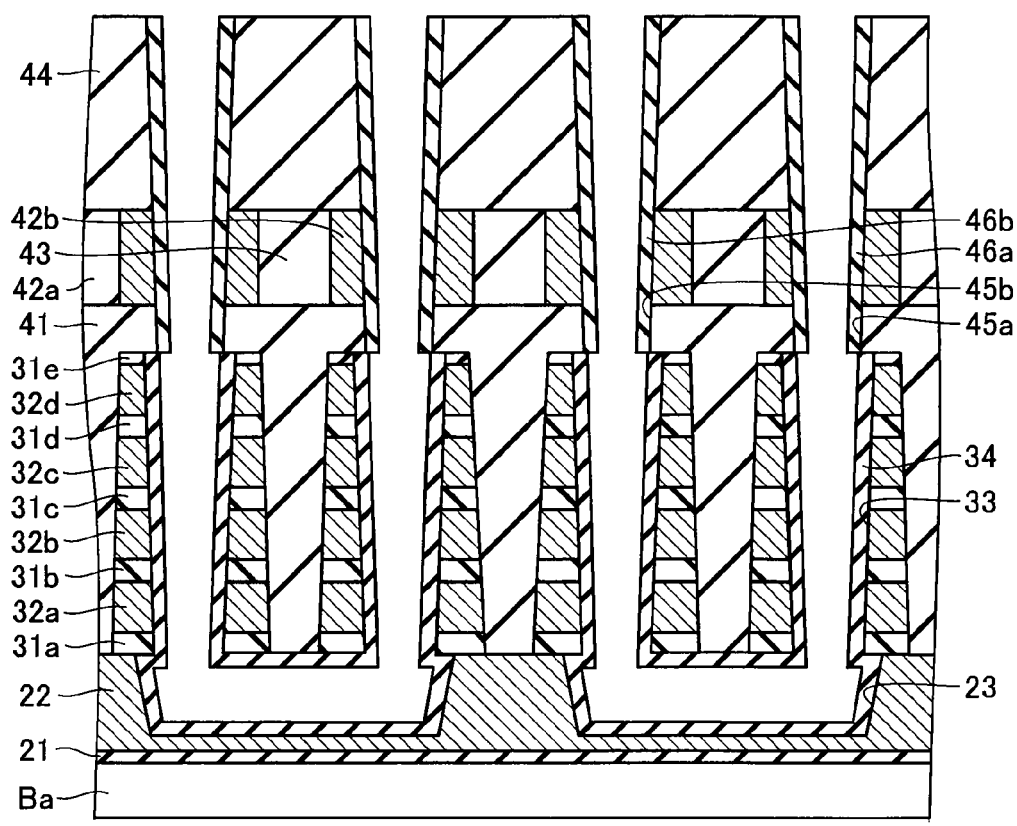
FIG. 31 is a cross-sectional view showing a manufacturing process of the nonvolatile semiconductor memory device in accordance with the third embodiment.
Figure 32:
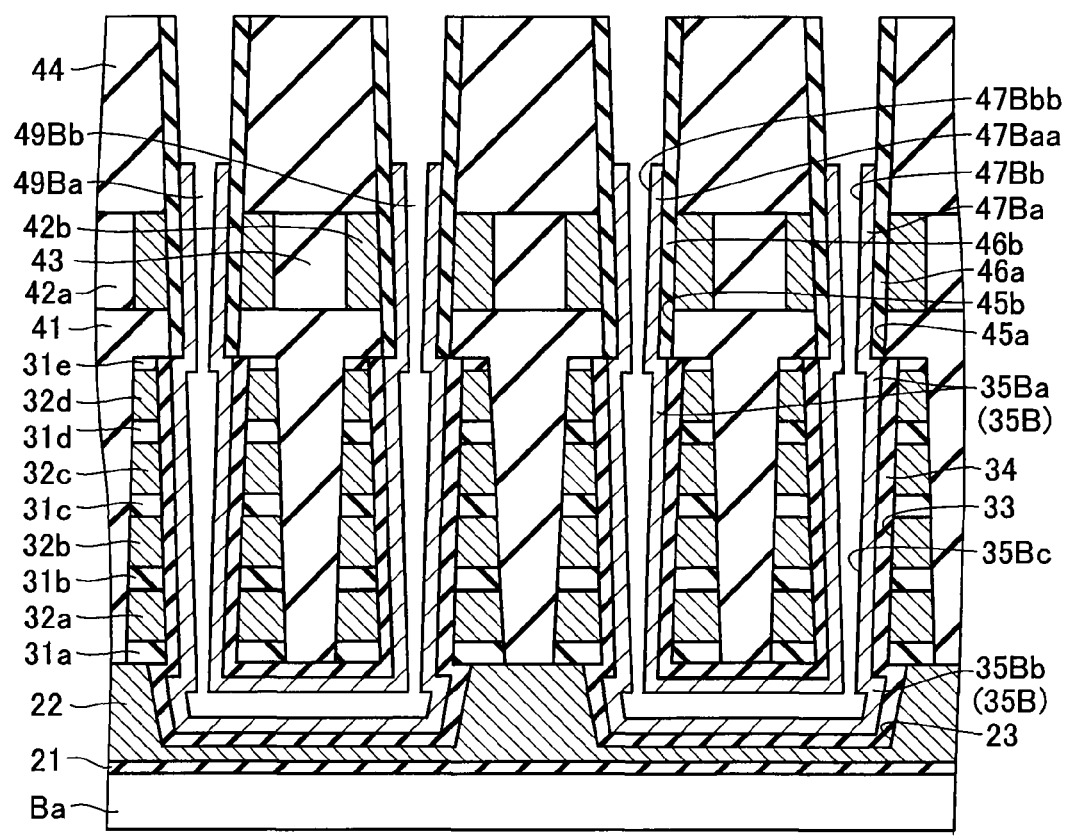
FIG. 32 is a cross-sectional view showing a manufacturing process of the nonvolatile semiconductor memory device in accordance with the third embodiment.
Figure 33:
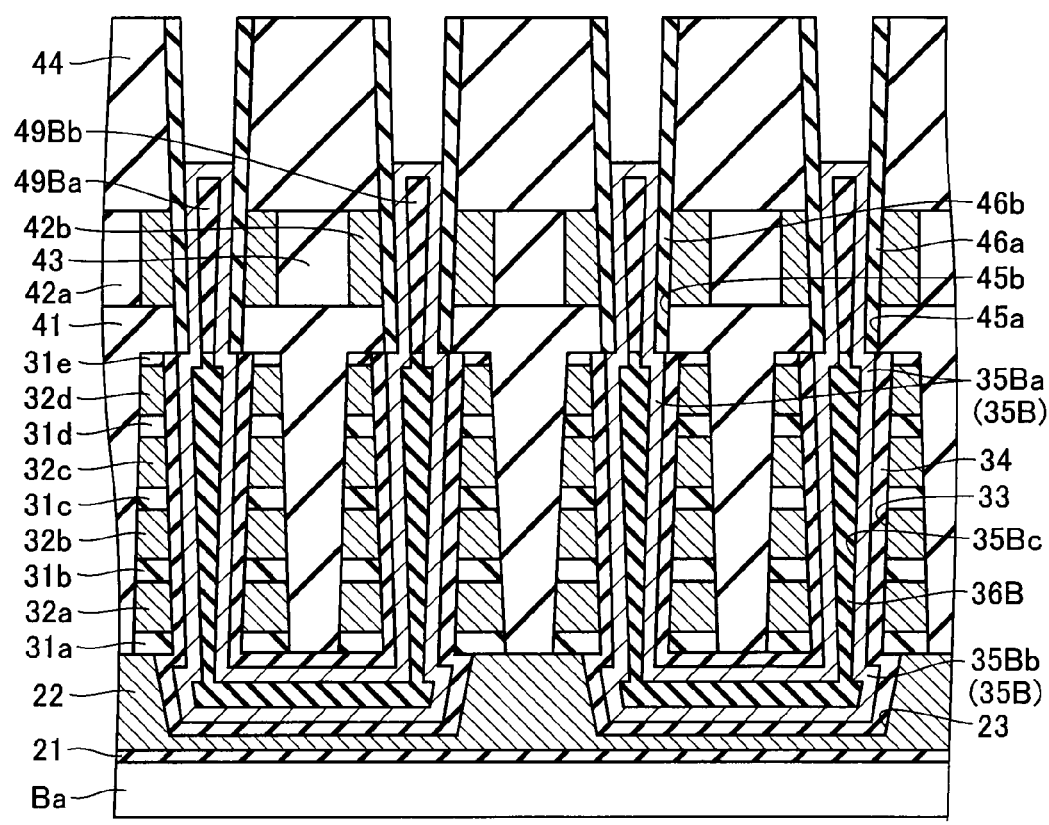
FIG. 33 is a cross-sectional view showing a manufacturing process of the nonvolatile semiconductor memory device in accordance with the third embodiment.

Next, a method of manufacturing the nonvolatile semiconductor memory device in accordance with the third embodiment is described with reference to FIGS. 31-33. FIGS. 31-33 are cross-sectional views showing a manufacturing process of the nonvolatile semiconductor memory device in accordance with the third embodiment.

First, processes are executed up to and including those shown in FIGS. 6-16 of the first embodiment. Next, as shown in FIG. 31, the memory gate insulating layer 34 is formed on a side wall in the memory holes 33; and the drain side gate insulating layer 46a and the source side gate insulating layer 46b are formed in the drain side hole 45a and the source side hole 45b, respectively.

Then, as shown in FIG. 32, the U-shaped semiconductor layer 35B, the drain side columnar semiconductor layer 47Ba, and the source side columnar semiconductor layer 47Bb are formed on a side surface in the memory holes 33, a side surface in the drain side hole 45a, and a side surface in the source side hole 45b, respectively. Here, the U-shaped semiconductor layer 35B, the drain side columnar semiconductor layer 47Ba, and the source side columnar semiconductor layer 47Bb are formed continuously in an integrated manner. The drain side columnar semiconductor layer 47Ba and the source side columnar semiconductor layer 47Bb are formed to a predetermined height of the drain side hole 45a and the source side hole 45b, respectively. The U-shaped semiconductor layer 35B, the drain side columnar semiconductor layer 47Ba, and the source side columnar semiconductor layer 47Bb are formed so as to include the hollows 35Bc, 47Baa, and 47Bbb, respectively.

Next, as shown in FIG. 33, silicon oxide (SiO$_2$) is deposited so as to fill the hollow 35Bc of the U-shaped semiconductor layer 35B, thereby forming the internal insulating layer 36B. Subsequently, BSG is deposited so as to fill the hollow 47Baa of the drain side columnar semiconductor layer 47Ba and the hollow 47Bbb of the source side columnar semiconductor layer 47Bb, thereby forming the internal insulating layers 49Ba and 49Bb, respectively.

Next, subsequent to the process shown in FIG. 33, boron (B) contained in the internal insulating layers 49Ba and 49Bb diffuses into the drain side columnar semiconductor layer 47Ba and the source side columnar semiconductor layer 47Bb. As a result, the effective impurity concentration of the drain side columnar semiconductor layer 47Ba and the source side columnar semiconductor layer 47Bb becomes smaller than the effective impurity concentration of the U-shaped semiconductor layer 35B. Then, subsequent to executing the processes shown in FIGS. 22 and 23 of the first embodiment, the wiring layer 50 is formed, thereby forming the nonvolatile semiconductor memory device shown in FIG. 30.

(Advantage of the Nonvolatile Semiconductor Memory Device in Accordance with the Third Embodiment)

Next, an advantage of the nonvolatile semiconductor memory device in accordance with the third embodiment is described. The nonvolatile semiconductor memory device in accordance with the third embodiment has the same advantages as that of the second embodiment.

In addition, in the nonvolatile semiconductor memory device in accordance with the third embodiment, the U-shaped semiconductor layer 35B, the drain side columnar semiconductor layer 47Ba, and the source side columnar semiconductor layer 47Bb are formed continuously in an integrated manner. Consequently, in the nonvolatile semiconductor memory device in accordance with the third embodiment, a resistance between the drain side select transistor SDTr and the memory transistor MTr1 can be suppressed; and a resistance between the source side select transistor SSTr and the memory transistor MTr8 can be suppressed.

OTHER EMBODIMENTS

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention.

For example, in the above-described embodiments, the nonvolatile semiconductor memory device has a configuration including a U-shaped semiconductor layer, but it may also have a configuration including an I-shaped (columnar) semiconductor layer.

What is claimed is:

1. A nonvolatile semiconductor memory device, comprising:
    a plurality of memory strings each of which has a plurality of electrically rewritable memory cells connected in series; and
    select transistors one of which is connected to each of ends of each of said memory strings,
    each of said memory strings comprising:
    a first semiconductor layer having a pair of columnar portions extending in a perpendicular direction with respect to a substrate, and a joining portion formed so as to join lower ends of said pair of columnar portions;
    a charge storage layer formed to surround a side surface of said columnar portions; and
    a first conductive layer formed to surround said charge storage layer and the side surface of said columnar portions,
    and
    each of said select transistors comprising:
    a second semiconductor layer extending upwardly from an upper surface of said columnar portions;
    a gate insulating layer formed to surround a side surface of said second semiconductor layer; and
    a second conductive layer formed to surround said gate insulating layer and the side surface of said second semiconductor layer,
    said first conductive layer functioning as a control electrode of said memory cells,
    said second conductive layer functioning as a control electrode of said select transistors, and
    an effective impurity concentration of said second semiconductor layer being less than or equal to an effective impurity concentration of said first semiconductor layer.

2. The nonvolatile semiconductor memory device according to claim 1,
    wherein the effective impurity concentration of said first semiconductor layer is $1 \times 10^{19}$ cm$^{-3}$ or more, and the effective impurity concentration of said second semiconductor layer is $3 \times 10^{17}$ cm$^{-3}$ or less.

3. The nonvolatile semiconductor memory device according to claim 1,
    wherein said first semiconductor layer and said second semiconductor layer include a hollow therein.

4. The nonvolatile semiconductor memory device according to claim 3, further comprising:
    a first insulating layer formed in said hollow of said first semiconductor layer; and
    a second insulating layer formed in said hollow of said second semiconductor layer.

5. The nonvolatile semiconductor memory device according to claim 4,
    wherein said first semiconductor layer and said second semiconductor layer are formed continuously in an integrated manner and configured as a first conductive type, and
    wherein said second insulating layer has an effective impurity concentration of a second conductive type that is higher than said first insulating layer.

6. The nonvolatile semiconductor memory device according to claim 5,
    wherein said first semiconductor layer and said second semiconductor layer are constituted by polysilicon doped with phosphorus.

7. The nonvolatile semiconductor memory device according to claim 1,
    wherein said first conductive layer is constituted by polysilicon, and said second conductive layer is constituted by polysilicon doped with boron.

8. The nonvolatile semiconductor memory device according to claim 4,
    wherein said first insulating layer and said second insulating layer are constituted by silicon oxide.

9. The nonvolatile semiconductor memory device according to claim 5,
    wherein said first insulating layer and said second insulating layer are constituted by silicon oxide doped with boron.

10. The nonvolatile semiconductor memory device according to claim 1, further comprising a third conductive layer formed so as to cover a lower portion of said joining portion.

11. The nonvolatile semiconductor memory device according to claim 1,
    wherein said first conductive layer is formed in a plurality, ends of said first conductive layer being shaped into a stepped shape.

* * * * *